United States Patent [19]
Arai et al.

[11] Patent Number: 5,304,512
[45] Date of Patent: Apr. 19, 1994

[54] PROCESS FOR MANUFACTURING SEMICONDUCTOR INTEGRATED CIRCUIT DEVICE, AND MOLDING APPARATUS AND MOLDING MATERIAL FOR THE PROCESS

[75] Inventors: Katsuo Arai, Takasaki; Sumio Okada, Chigasaki; Takashi Ooba, Takasaki; Kazuya Takahashi, Isesaki; Mayumi Kaneko, Takasaki, all of Japan

[73] Assignee: Hitachi, Ltd., Tokyo, Japan

[21] Appl. No.: 994,888

[22] Filed: Dec. 22, 1992

[30] Foreign Application Priority Data

Dec. 25, 1991 [JP] Japan ................................. 3-357062

[51] Int. Cl.⁵ .......................................... H01L 21/60
[52] U.S. Cl. ................................. 437/211; 437/209;
437/212; 437/214; 437/216; 437/217; 437/219;
264/272.11; 264/272.14; 264/272.17
[58] Field of Search ............. 437/209, 211, 212, 214,
437/215, 216, 217, 219; 257/727, 789, 795;
264/272.11, 272.12, 272.13, 272.14, 272.15, 272.17

[56] References Cited

FOREIGN PATENT DOCUMENTS 57-39558  3/1982  Japan .
57-148360 9/1982  Japan .
58-18931  2/1983  Japan .
58-122757 7/1983  Japan .
58-165333 9/1983  Japan .

Primary Examiner—Brian E. Hearn
Assistant Examiner—Kevin M. Picardat
Attorney, Agent, or Firm—Fay, Sharpe, Beall, Fagan, Minnich & McKee

[57] ABSTRACT

A chip 12 having an electric circuit and a plurality of leads 8 connected electrically with the chip 12 are molded in a resin-sealed package 46 by a molding material containing a main component of a resin, by introducing a molding compound sheet 20 into the cavities 33 of molds 31, 32 before the molds are clamped, by melting the molding compound sheet 20 in the cavities 33 into a liquid molding material 45 after the mold clamping action to pressure fill up the inside of the cavities 33, and by setting the liquid molding material 45 integrally.

61 Claims, 31 Drawing Sheets

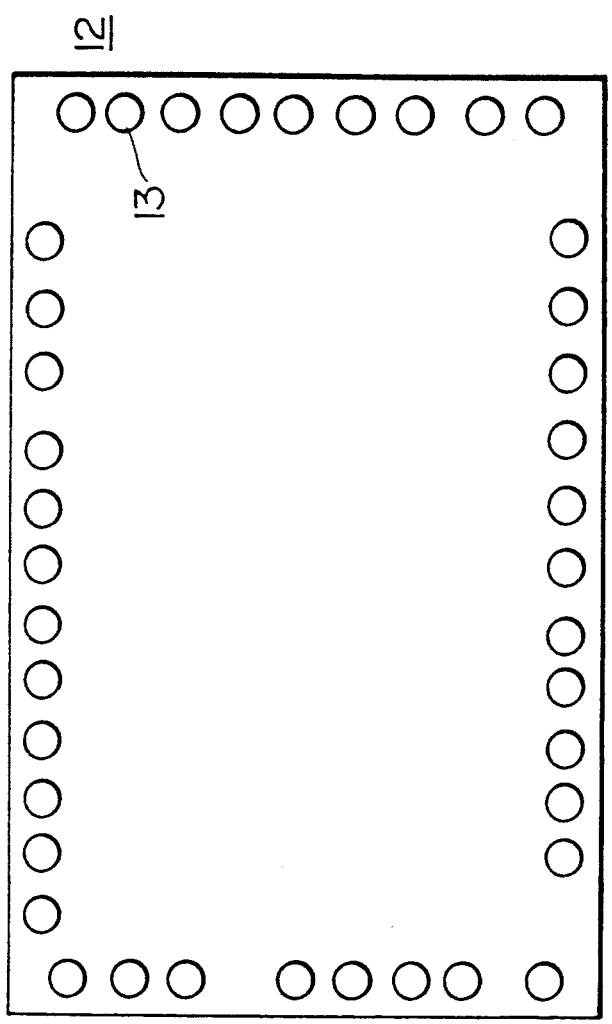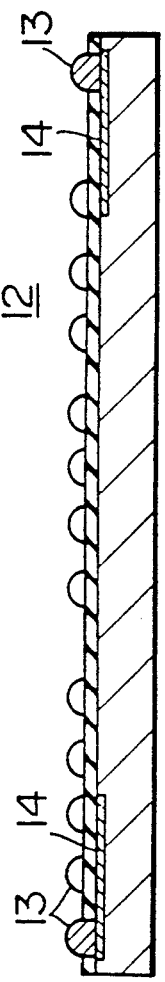

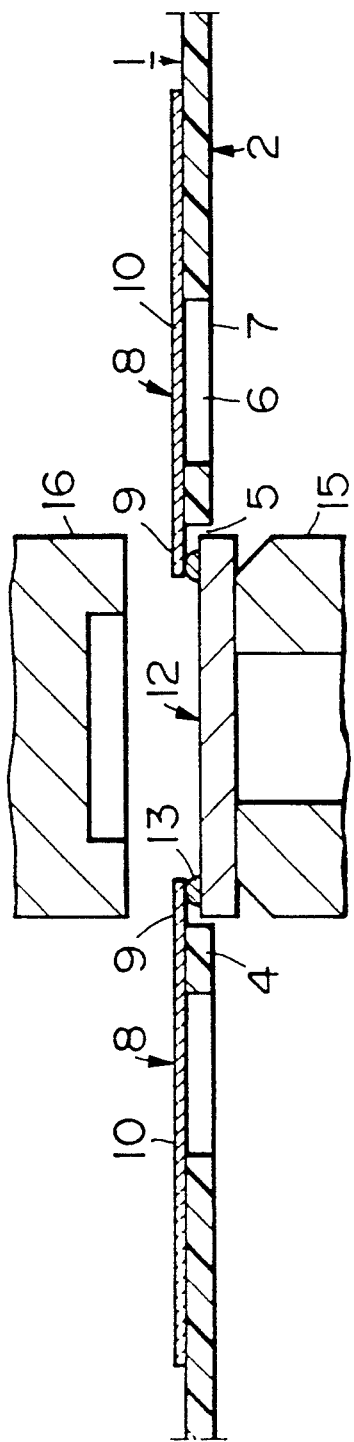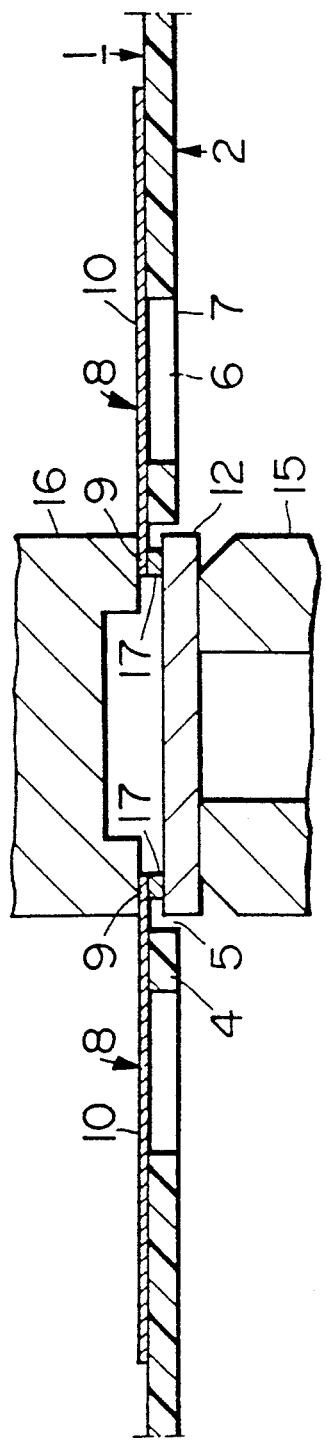

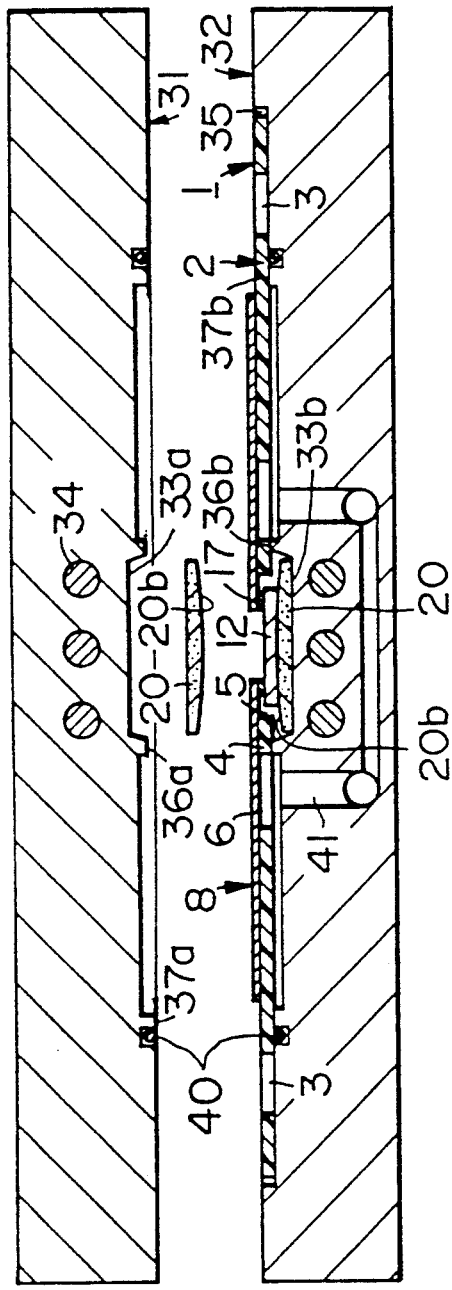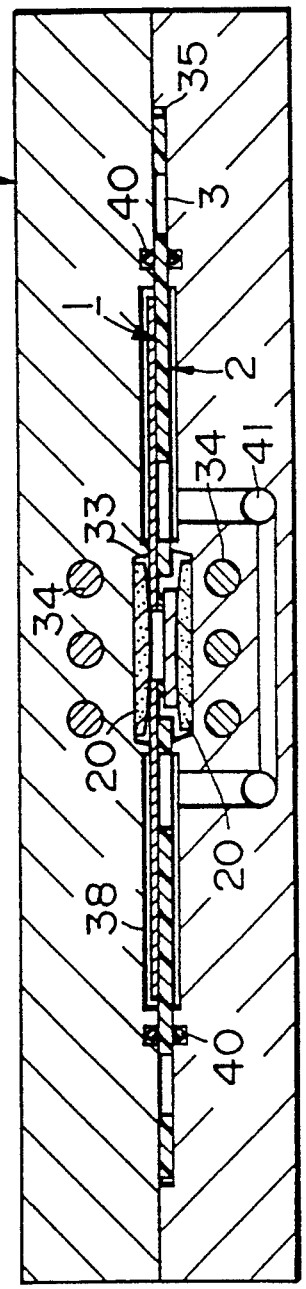
FIG. 8A
FIG. 8B

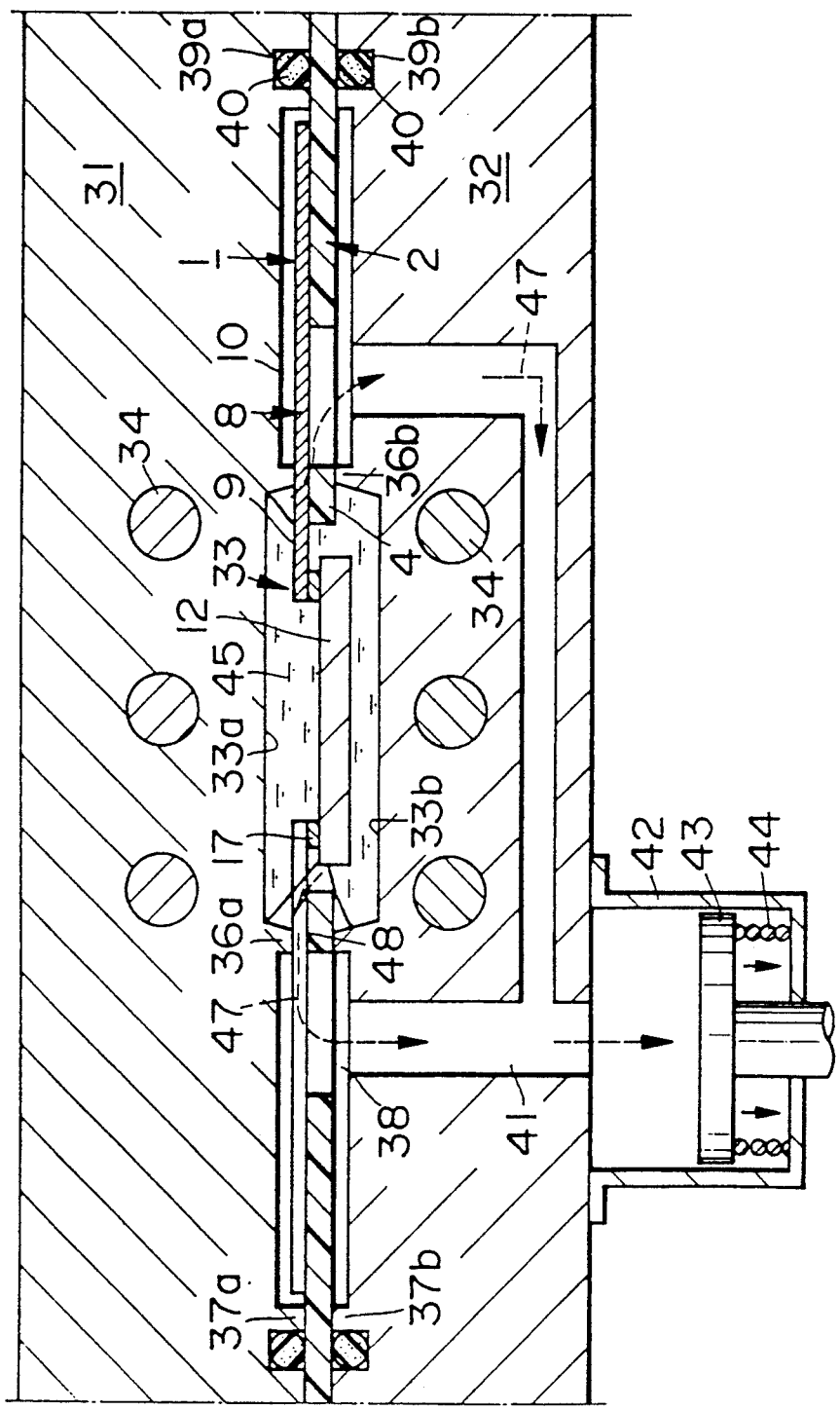

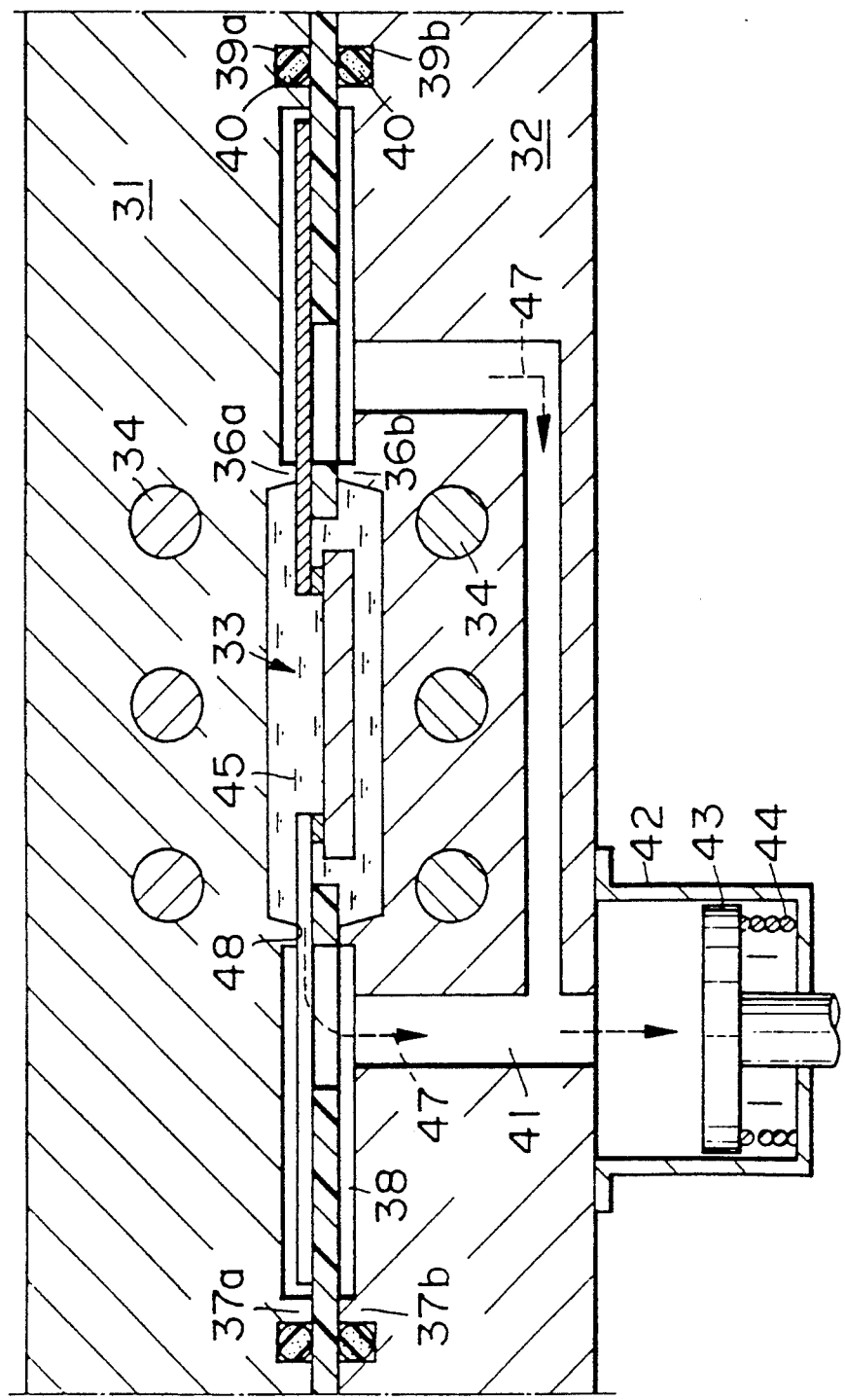

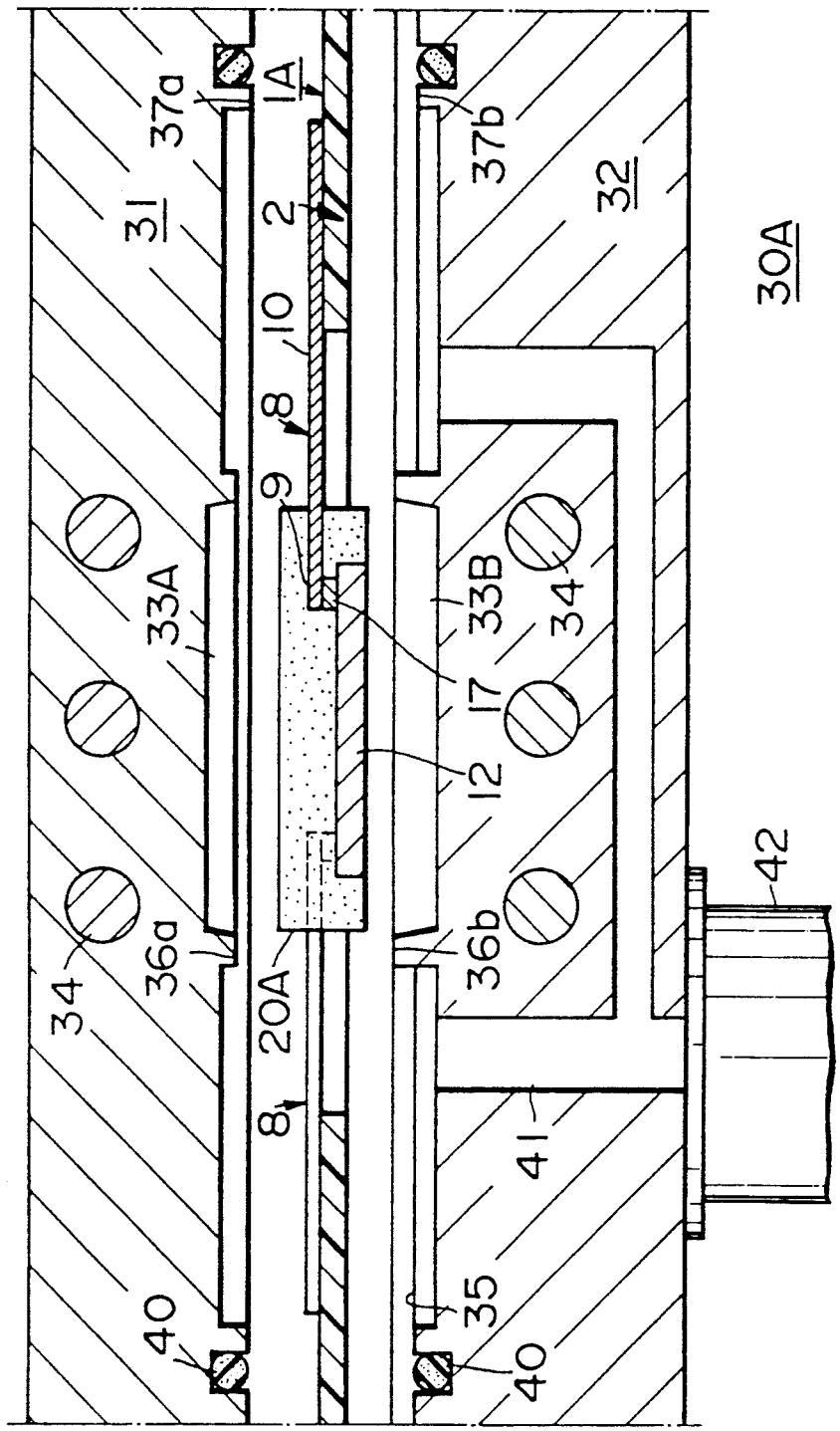

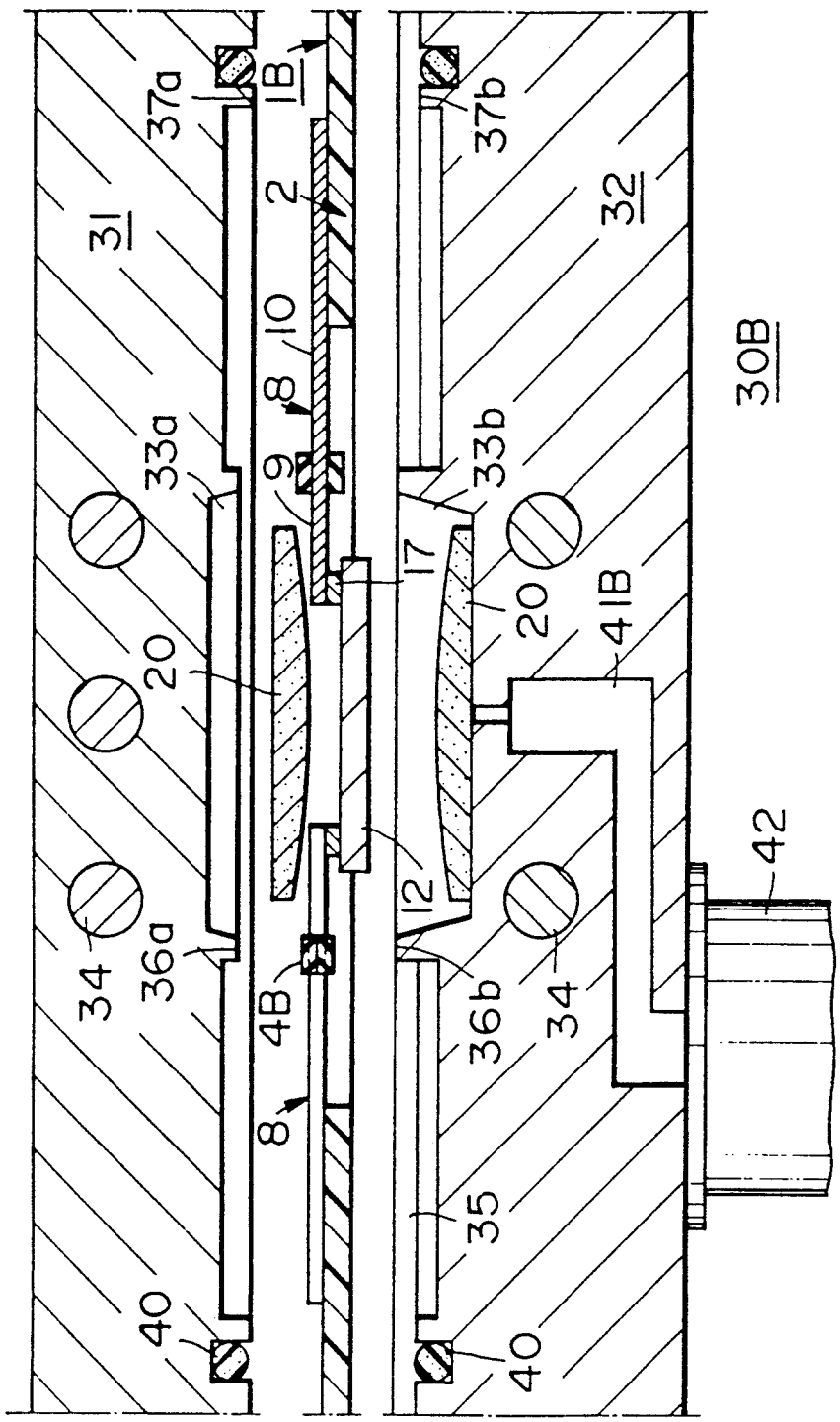

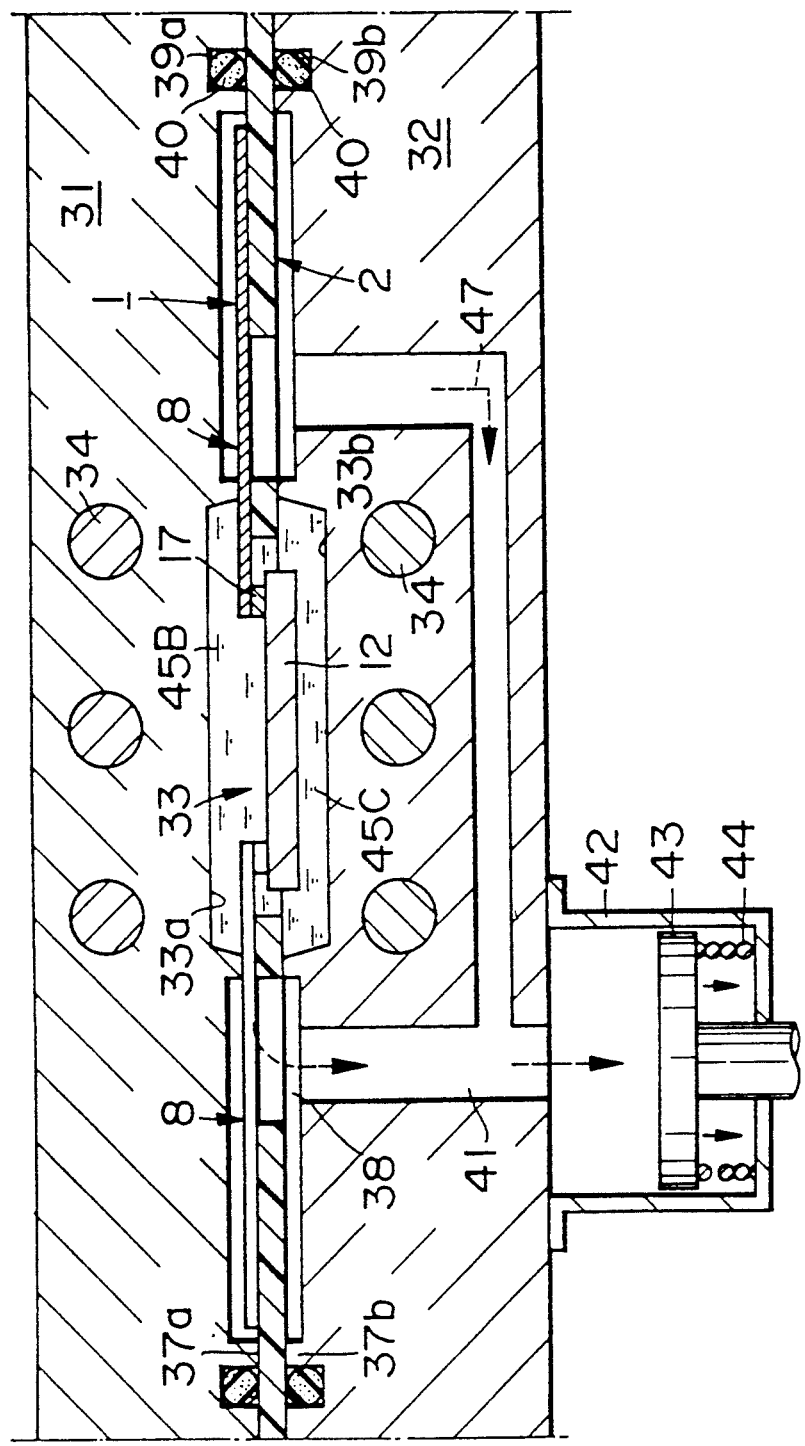

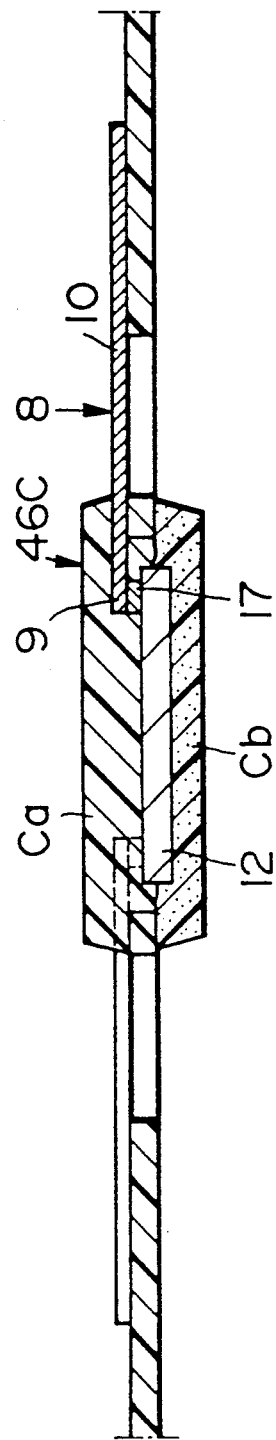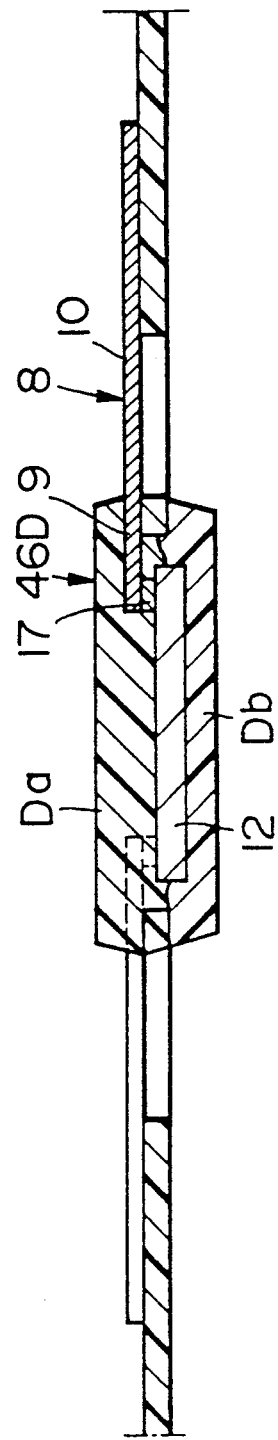

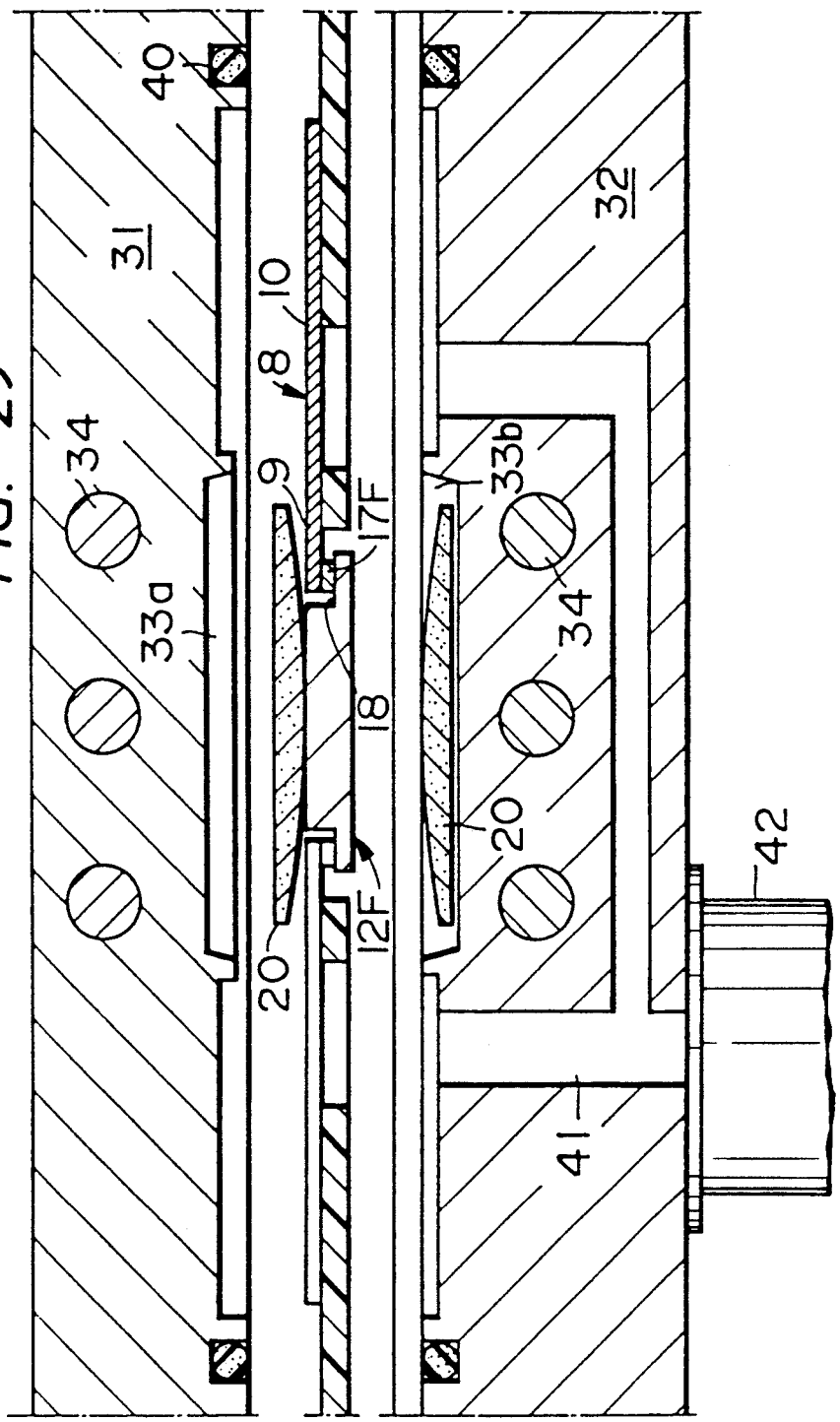

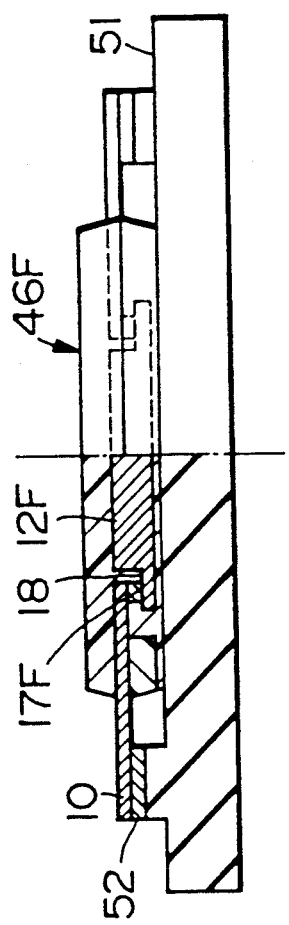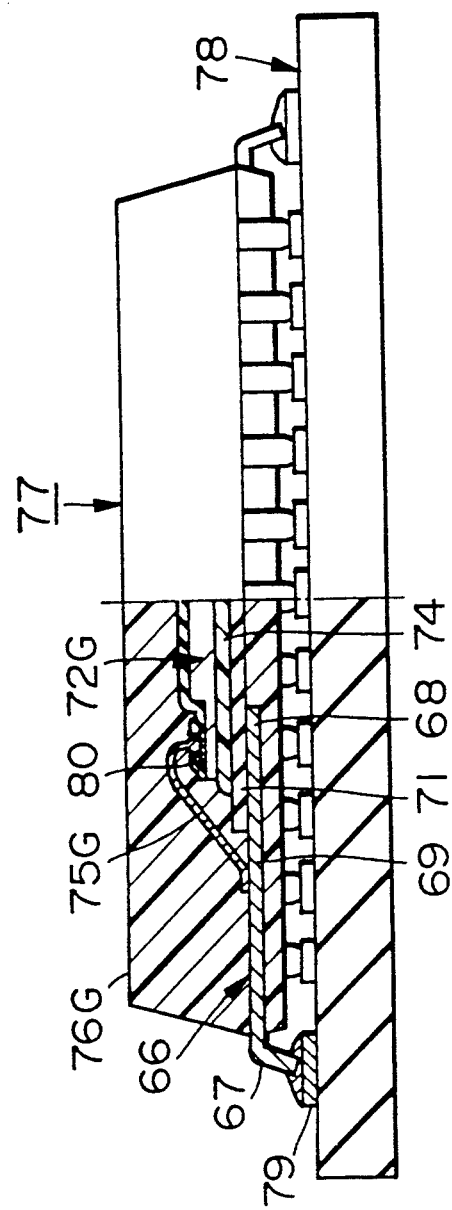

PROCESS FOR MANUFACTURING SEMICONDUCTOR INTEGRATED CIRCUIT DEVICE, AND MOLDING APPARATUS AND MOLDING MATERIAL FOR THE PROCESS

BACKGROUND OF THE INVENTION

The present invention relates to manufacturing a semiconductor integrated circuit device and, more particularly, to an extremely thin surface-mounted type resin-sealed package. In recent years, a semiconductor integrated circuit device equipped with the surface-mounted type resin-sealed package IC is used in a wide variety of fields because it can be packaged thinly and densely on a printed circuit board. Moreover, the surface-mounted type resin-sealed package IC is required to have a smaller thickness in accordance with recent technical innovation. On the other hand, a semiconductor chip to be encapsulated in the package of the surface-mounted type resin-sealed package IC has a larger planar size.

In the prior art, the surface-mounted type resin-sealed package IC is encapsulated by using a transfer molding machine. This transfer molding machine is constructed to include: a pair of upper and lower molds to be opened and closed; a cavity formed between the mating faces of the upper and lower molds and having a gate opening; a pot formed in the upper or lower mold; a runner formed in the upper or lower mold face for establishing communication between the pot and the gate; and a heater for heating and melting tablets of a molding material introduced into the pot.

In case a package is to be encapsulated by using the transfer molding machine, a lead frame having a semiconductor chip adhered thereto is set at first in the cavity with the upper and lower molds being opened, and this cavity is then pressure charged with a resin or molding material. Prior to a step for encapsulating a semiconductor chip, the semiconductor chip is bonded to tabs of the lead frame, and the individual leads of the lead frame and the bonding pads of the semiconductor chip are electrically connected by wires.

When the semiconductor chip is set in the cavity, the upper and lower molds are clamped to seal the lead frame between them. After this mold clamping, the tablets are introduced into the mold pot. The tablets thus introduced are heated and melted into a resin or a liquid molding material by the heaters, which are in the upper and lower molds. This molten resin is extruded from the pot to the runner by a plunger. The resin thus extruded runs from the gate to fill the cavity. The liquid resin in the cavity is set to a solid molding material by the cross-linking reaction resulting from the heating. The resin-sealed package is thus molded of the set solid molding material.

The tablets are prepared by kneading a molding material containing an epoxy resin as a base component, by pulverizing the kneaded material and by stamping the powdery molding material into a cylindrical shape. The resin is prepared by heating the tablet to melt the molding material into a liquid state. In short, in the transfer molding machine, the solid tablet is heated outside of the cavity to form the liquid resin, and this liquid resin is fed from the outside to the inside of the cavity.

An IC for realizing an extremely thin shape is exemplified by an "IC of TAB structure", in which the chip and the leads are connected electrically and mechanically by tape automated bonding (TAB). In this IC of TAB structure, the connected portions of the chip and the leads are resin-sealed with resins which is molded by potting. A resin-molding process in this IC of TAB structure is exemplified by the resin-sealed package molding process, as will be described in the following.

The solid resin is placed on the semiconductor chip that is preautomated-bonded to the leads. If, in this state, the semiconductor chip is guided through a hot-air drying furnace or a heated tunnel furnace, the solid resin is melted so that it softens and flows to cover the connected areas of the semiconductor chip and the leads. The covering resin is set later to form the resin-coated package. This resin-coated package has an extremely small thickness in its entirety because what is covered by resin is limited to the connected portions between the semiconductor chip and the leads in the vicinity of the chip.

The following patent specifications disclose the technology of covering the connected areas of the semiconductor chip and the lead group by melting a solid resin: Japanese Patent Laid-Open Nos. 39558/1982, 148360/1982, 18931/1983, 122757/1983 and 165333/1983.

SUMMARY OF THE INVENTION

In case a prior art resin-sealed package having an extremely small thickness (two times or less the thickness of a semiconductor chip) is to be molded by using a transfer molding apparatus, the resin or the liquid molding material must flow through a narrow passage in the cavity. Thus, due to the narrow passage, there is a large amount of heat transfer from the mold to the molding material during flow of the molding material and friction, which generates heat, to partially cure or set the resin as it is still flowing to raise its viscosity. As a result: the wires bridging the semiconductor chip and the individual leads may be deformed by the high viscosity resin; the tabs having the semiconductor chip adhered thereto may move; or there may be a portion left uncharged with the resin. If the wires are deformed, there arises another problem that the wires themselves may be shorted or that the wires and the chip or leads may be shorted.

If the resin is provided with a low viscosity to avoid the aforementioned problem it will leak to the outside of the cavity from the gap between the mating faces of the upper and lower molds, so that a resin flash is formed.

The foregoing problems cause restrictions on the designing of the composition of the molding material.

On the other hand, the prior art process for forming a resin-coated package by using a potting process for the aforementioned resin-coated package IC of TAB structure is accompanied by the following problems: Since the resin-coated package molded by the potting method has a lower resin density than that of the resin-sealed package pressure-molded by the transfer molding process, it is inferior in reliability as to humidity resistance or mechanical strength. Since the resin-coated package molded by the potting process has a contour depending upon the free fluidicity of the resin or the liquid molding material, its accuracy in external size is low.

Objects of the present invention are to provide a semiconductor integrated circuit device manufacturing process for forming a thin resin-sealed package having improved humidity resistance and mechanical strength, while preventing resin flash, deformation of wires, movement of tabs and formation of an uncharged portion.

The molding material is molded while being confined in the cavity in accordance with the present invention, so that the density of the molding material is as high as that according to the transfer molding process and the molding material has an excellent reliability in humidity resistance and mechanical strength.

The present invention resin-sealed package has its contour defined by the cavity, for an enhanced size accuracy. The cavity is not charged with liquid molding material from the outside, but the molding material is set in advance in the cavity and is melted to fill the cavity. In the cavity, the liquid molding material is transferred a small amount so that its viscosity will hardly change. There is minimal flow in the narrow passages and therefore minimal friction heat generation so that the viscosity will not significantly increase during flow.

Thus, the liquid molding material in the cavity keeps a preset viscosity so that the wires bridging the semiconductor chip and the individual leads will not be deformed, the wires will not short to other wires and the chip. Moreover, the connected portions between the bonding pads of the semiconductor chip and the wires are not stripped or broken off or damaged by liquid molding material having a high viscosity, the semiconductor chip will not move relative to mechanically connected tabs or leads, and there is no uncharged portion.

On the other hand, the liquid molding material in the cavity has its viscosity kept to an optimum level so that it can be prevented from leaking to the outside of the cavity from the gap between the mating faces of the upper and lower molds thereby to prevent any formation of the resin flash.

Since the properties such as the viscosities of the liquid molding material and the molding criteria can be determined depending upon the composition of the molding material before the liquidification and since the liquid molding material in the cavity maintains a preset viscosity, the degree of freedom in choice of the composition of the molding material can be enhanced. This makes it possible to use a resin or the like exhibiting a high performance as a main component, to select an additive freely and to enhance a variety of performances relating to the humidity resistance or the mechanical strength of the molded resin-sealed package.

BRIEF DESCRIPTION OF THE DRAWINGS

The foregoing and other objects and novel features of the present invention will become apparent from the following description to be made with reference to the accompanying drawings:

FIGS. 3a and 3b present an enlarged top plan view and an enlarged sectional front elevation showing a chip;

FIGS. 4a and 4b present partially enlarged sectional front elevations showing inner lead bonding;

FIGS. 8a and 8b, 9 and 10 present enlarged sectional front elevations of the molding;

FIGS. 13 and 14 correspond to FIGS. 9 and 10 for an embodiment 2 of the present invention;

FIGS. 16, 17 and 18 correspond to FIGS. 6, 7 and 9, but show a third embodiment;

FIGS. 20 and 21 correspond to FIGS. 6 and 9, according to an embodiment 4 of the present invention;

FIGS. 22a and 22b present sectional front elevations individually showing two kinds of embodiment 4 surface-mounted type resin-sealed package ICs;

FIG. 29 is a partially omitted, enlarged and exploded sectional front elevation showing a step of molding a resin-sealed package in a semiconductor integrated circuit device according to an embodiment 6 of the present invention;

FIG. 30 is a partially cut-away front elevation showing a packaged state of the embodiment 6;

FIG. 32 is a partially cut-away sectional front elevation showing a surface-mounted type resin-sealed package IC manufactured of embodiment 7.

DETAILED DESCRIPTION OF THE PREFERRED EMBODIMENTS

Figure 1:
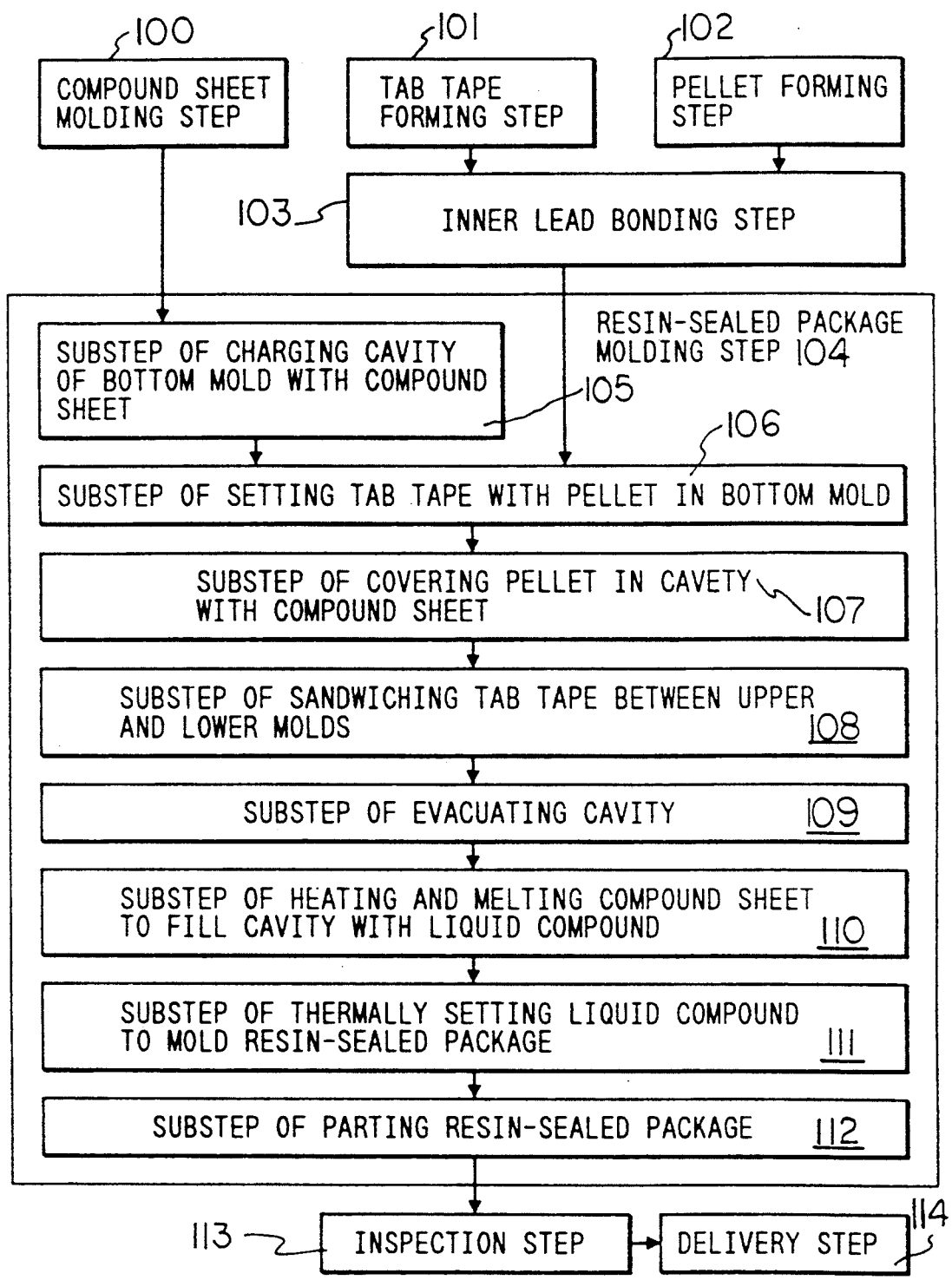
FIG. 1 is a flow chart showing manufacturing a semiconductor integrated circuit device according to the present invention.
Figure 12A:
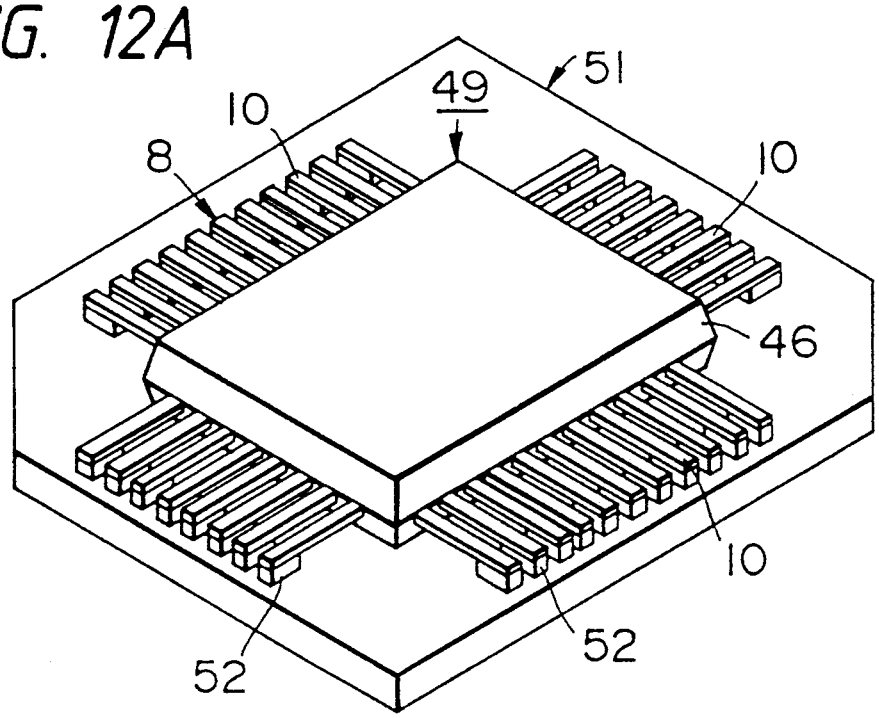
FIGS. 12a and 12b present a partially omitted perspective view and a partially cut-away front elevation showing the surface mounted type resin-sealed package IC.
Figure 12B:
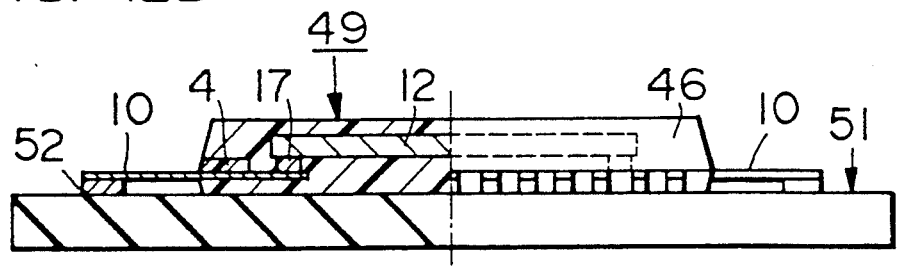

FIGS. 12A and 12B are a perspective view and a partially cutaway section showing a surface-mounted type resin-sealed package IC produced by step 104, FIG. 1. This surface-mounted type resin-sealed package IC 49 has its resin-sealed body 46 formed into a generally square plate having four sides, the lower edges of which individually have a plurality of outer leads 10 projected therefrom. A semiconductor chip 12 having a built-in electric circuit is tape-automated bonded to leads 8 which are adhered to a resin film. The chip 12 and leads 8 are partially resin-sealed by the resin-sealed package 46.

Figure 2:
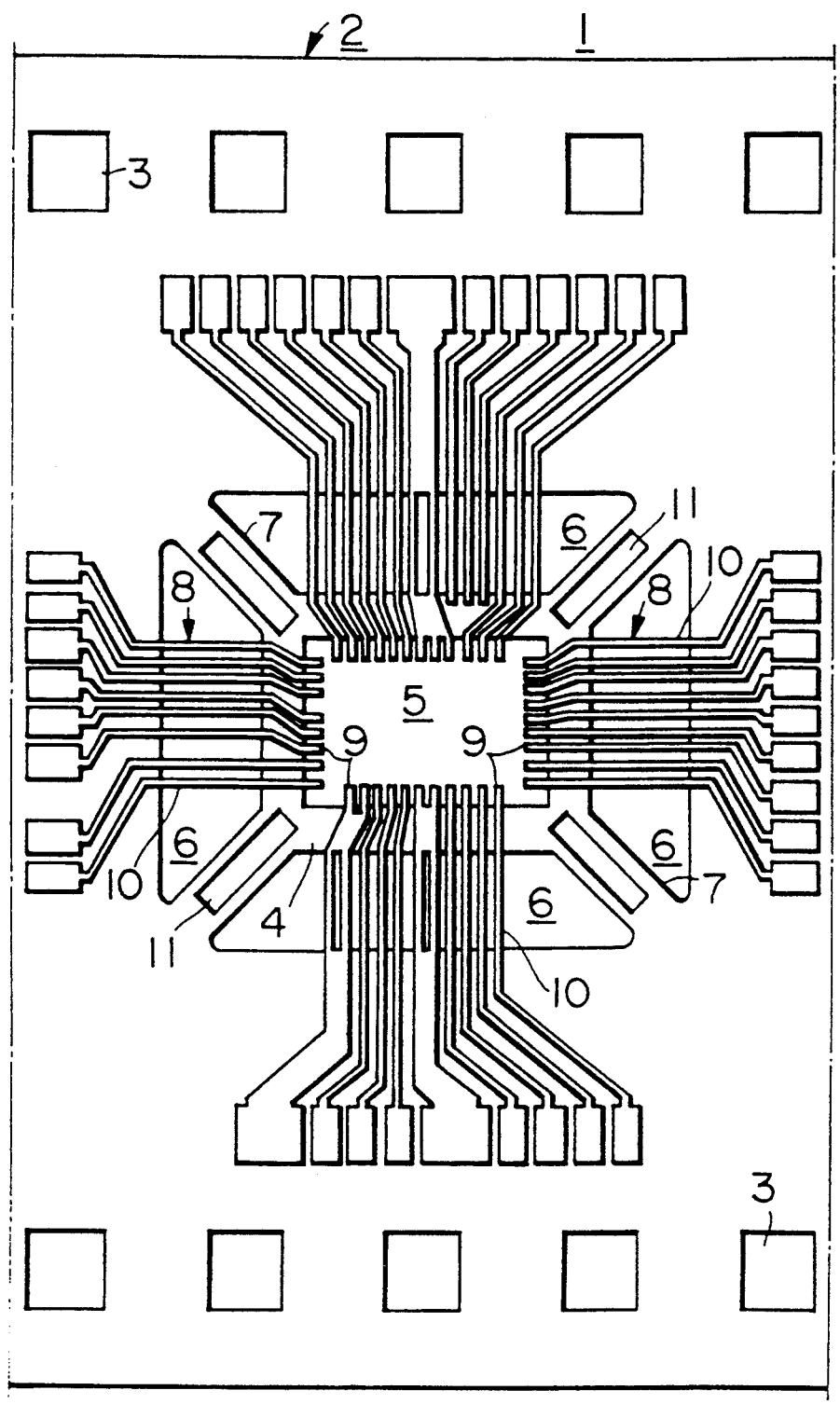
FIG. 2 is a partially omitted top plan view showing a TAB tape.

In the step 101 there is formed a TAB tape 1, as shown in FIG. 2. This TAB tape 1 is constructed of a carrier tape 2 which is made of an insulating resin such as polyimide and molded such that a series of identical pattern units are integrally formed in the longitudinal direction. However, the description and illustration are for only one unit.

The carrier tape 2 has, at the two widthwise sides thereof, perforations 3 at an equal pitch for feed of the carrier tape 2, and one row of support rings 4 at an equal pitch between the two rows of perforations 3. Each support ring 4 is a generally square frame shape, forming a chip mount inside recess 5. In the outside recesses 6, individually at four corners of the support ring 4, there are four integral holding members 7 for holding the support ring.

A plurality of leads 8, for electrically connecting an integrated circuit formed in the semiconductor chip, are arranged over one surface ("principal face") of the carrier tape 2 and are fixed thereon by suitable means such as welding or adhering, using an electrically conductive material such as copper foil. The leads 8 are grouped for the four sides of the support ring 4 and are arranged to extend radially through the support ring 4 so that they are electrically disconnected from one another. The individual leads 8 have their inner leading end portions projected into the chip mount 5 to form inner leads 9 acting as an inner portion and their outer end portions projected to the outside across the outside recess 6 at each lead 8 to form the outer leads 10 acting as an outer portion. The outer leads 10 have their outer end portions fixed on the carrier tape 2. The individual leads 8 have their surfaces plated with tin films (although not shown) for enhancing the solderability.

Each of the four holding members 7 is formed with one compound sump 11 opened in each diagonal line of the chip mount 5. Each compound sump 11 has its inner end portion positioned in the support ring 4.

Although not detailed, the chip 12 is suitably prepared in step 102 from a wafer with a desired integrated circuit. Moreover, the chip 12 with the (not-shown) integrated circuit is divided, as shown in FIG. 3, into such a generally square small piece that it can be mounted in the chip mount 5 of the support ring 4. The chip 12 has one surface (principal face) formed in its periphery with a plurality of bumps 13 made of a gold material. These bumps 13 align with the individual inner leads 9 of the carrier tape 2. Each bump 13 is electrically connected with wiring 14 of the chip 12. Specifically the chip has its principal face formed with a plurality of bonding pads electrically connected with the wiring 14 and the individual bumps 13 are electrically connected with the bonding pads.

Next the chip 12 is inner-bonded to the leads 8 of the TAB tape 1 in step 103, the carrier tape 2 is tensioned between a plurality of (not-shown) sprockets and is intermittently fed in one direction. The chip 12 is arranged in the middle part of the tensed carrier tape 2 mounted in the chip mount 5 from below the support ring 4 while being held by a collet 15, as shown in FIG. 4A.

Then, the individual bumps 13 are aligned with the inner leads 9, as shown in FIG. 4B, and thermally bonded by a bonding tool 16 so that the chip is assembled in the carrier tape 2. Specifically, connecting terminals 17 made of a gold-tin eutectoid are formed between the tin-plated film covering the surfaces of the leads 8 and the bumps 13 made of a gold material so that the inner leads 9 of the lead 8 and the bumps 13 are bonded together by the individual connecting terminals 17.

The material for the bumps 13 is not limited to gold but may be a soldering material or aluminum. Moreover, the positions for the projected bumps 13 are not limited to the side of the chip 12 but may be located at the side of the inner leads 9.

Figure 5:
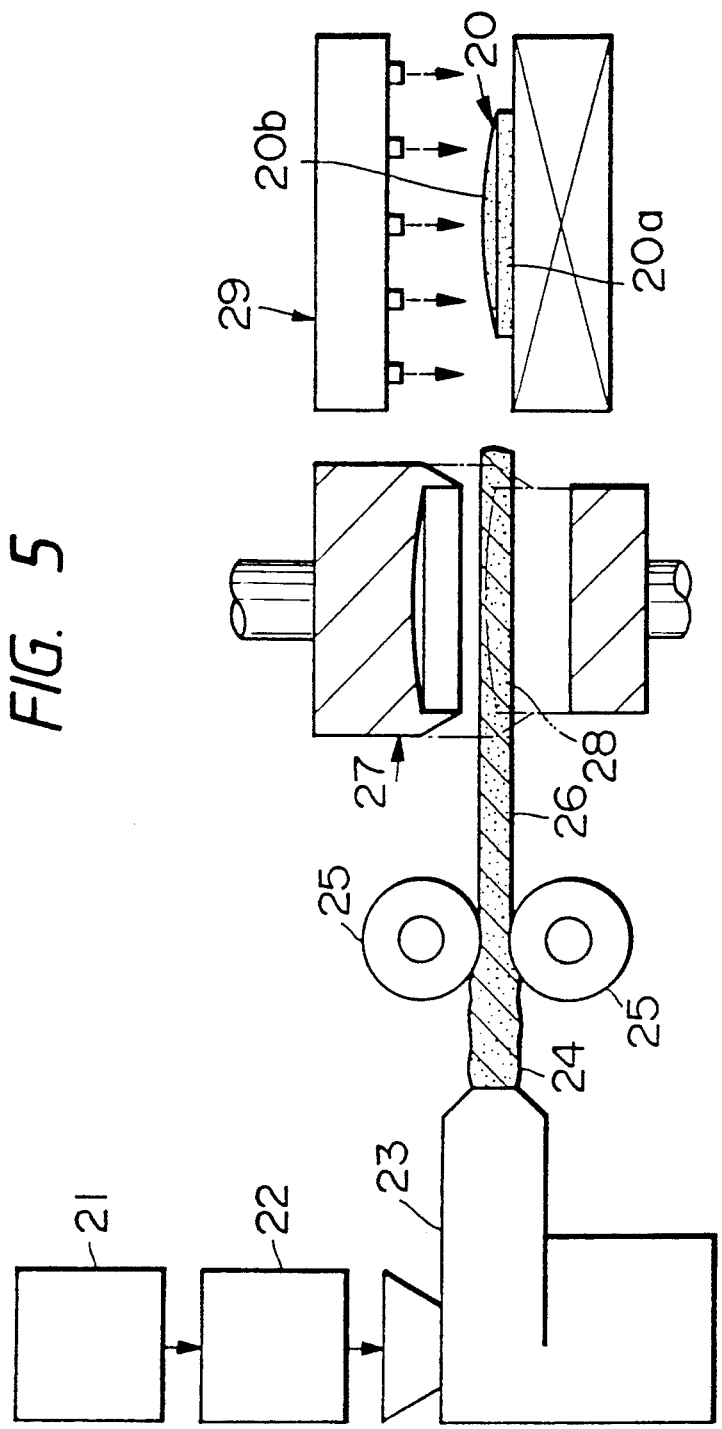
FIG. 5 is a schematic diagram showing a step of manufacturing a molding material sheet.

Next, the chip 12 and the leads 8 are resin-sealed by the later-described molding step 104 using a compound sheet prepared by step 100, shown in FIG. 5.

In the step 100 for preparing the compound sheet 20, the (not shown) raw material of the compound sheet 20 is composed mainly of an epoxy resin, to which are added in individually suitable amounts a thermosetting reactant such as a phenol resin, a setting promoter such as a thermosetting reaction catalyzer, a filler such as silica, a coupling agent, a fire retardant, a fire retarding agent, a coloring agent such as carbon, and a parting agent such as wax.

The raw material having the above-specified composition is blended in a powdery state at a predetermined blending ratio by a blender 21. The blended raw material is fed through a storage tank 22 to a kneader 23. The powdery raw material in the kneader 23 is kneaded while being heated to a suitable temperature (e.g., 100° C.). By this kneading operation, there is prepared a semi-fluid compound 24, like clay having a suitable viscosity. The semi-fluid compound 24 is extruded from the kneader 23 to pass through a pair of upper and lower rollers 25 into an elongated semi-fluid compound sheet 26, which is cut to a predetermined size and shaped into a predetermined shaped compound sheet 28 by a shaping cutter 27. This semi-fluid compound sheet 28 is cooled to room temperature by a cooler 29 and is changed to a completely solid state compound sheet 2. Preferably, the solid compound sheet 20 may be stored in a refrigerator (although not shown) until it is used, so that the thermosetting reaction may be prevented from naturally advancing in an uncontrolled state. The molding material solid sheet 20 has one flat principal face (first principal face) 20a and another convex principal face (second principal face) 20b so that it is thicker at a central portion than a circumferential portion.

The resin-sealed package molding apparatus used in step 104 for molding the resin-sealed package by using the molding material compound sheet 20 is not equipped with a pot, runner and gate, and nor is the resin or the liquid compound transferred to the inside of the cavity from the outside; hereinafter called the "transferless resin-sealed package molding apparatus".

The transferless resin-sealed package molding apparatus, 30 as shown in FIGS. 6 to 10, has a pair of upper and lower molds 31 and 32 which are clamped by means of a cylinder unit (although not shown). The upper mold 31 and the lower mold 32 have mating faces with a plurality of sets (although only one is shown) of upper cavity recesses 33a and lower cavity recesses 33b for associating to form one cavity 33 having a thickness about two times as large as that of the chip 12.

In the upper mold 31 and the lower mold 32, there are individual heaters 34 for heating the insides of the corresponding cavities 33. The lower mold 32 mating face has a relief recess 35 of a substantially constant depth rectangle slightly larger in size than the carrier tape 2 to accommodate the thickness of the carrier tape 2.

The upper and lower molds 31 and 32 are formed on their mating faces with clamping flanges 36a and 36b having a suitable width, and projecting from the circumferences of the openings of the individual cavities 33. Outside of the flanges 36a and 36b on the mating faces of the upper and lower molds 31 and 32, there are mold clamping flanges 37a and 37b which enclose the individual cavities 33 to establish minute spaces 38 around the individual cavities 33.

Outside of the mold clamping flanges 37a and 37b on the mating faces of the upper and lower molds 31 and 32, there are two opposed annular holding grooves 39a and 39b for seal rings 40 to enclose the individual cavities 33. These seal rings 40 are molded of an elastic material such as rubber into an annular shape so that they are compressed and deformed, when the upper and lower molds 31 and 32 are clamped, to seal the inside spaces completely between the mating faces of the upper and lower molds 31 and 32.

The lower mold 32 is formed with a plurality of air passages 41 for communicating with the mating face of the upper mold 31 inside of the seal ring 40. The air passages 41 are connected for fluid communication with an air sump 42 having a slidably fitted plunger 43 normally urged toward the air passage 41 by a spring 44.

According to step 105, the solid compound sheet 20 is fed to the individual cavity recesses 33b of the lower mold 32, as shown in FIG. 8A, with second principal convex face 20b being directed upward. These introductions of the grouped solid compound sheets 20 into the individual cavity recesses 33b can be accomplished automatically altogether by using a suitable handling apparatus (although not shown).

Figure 7:
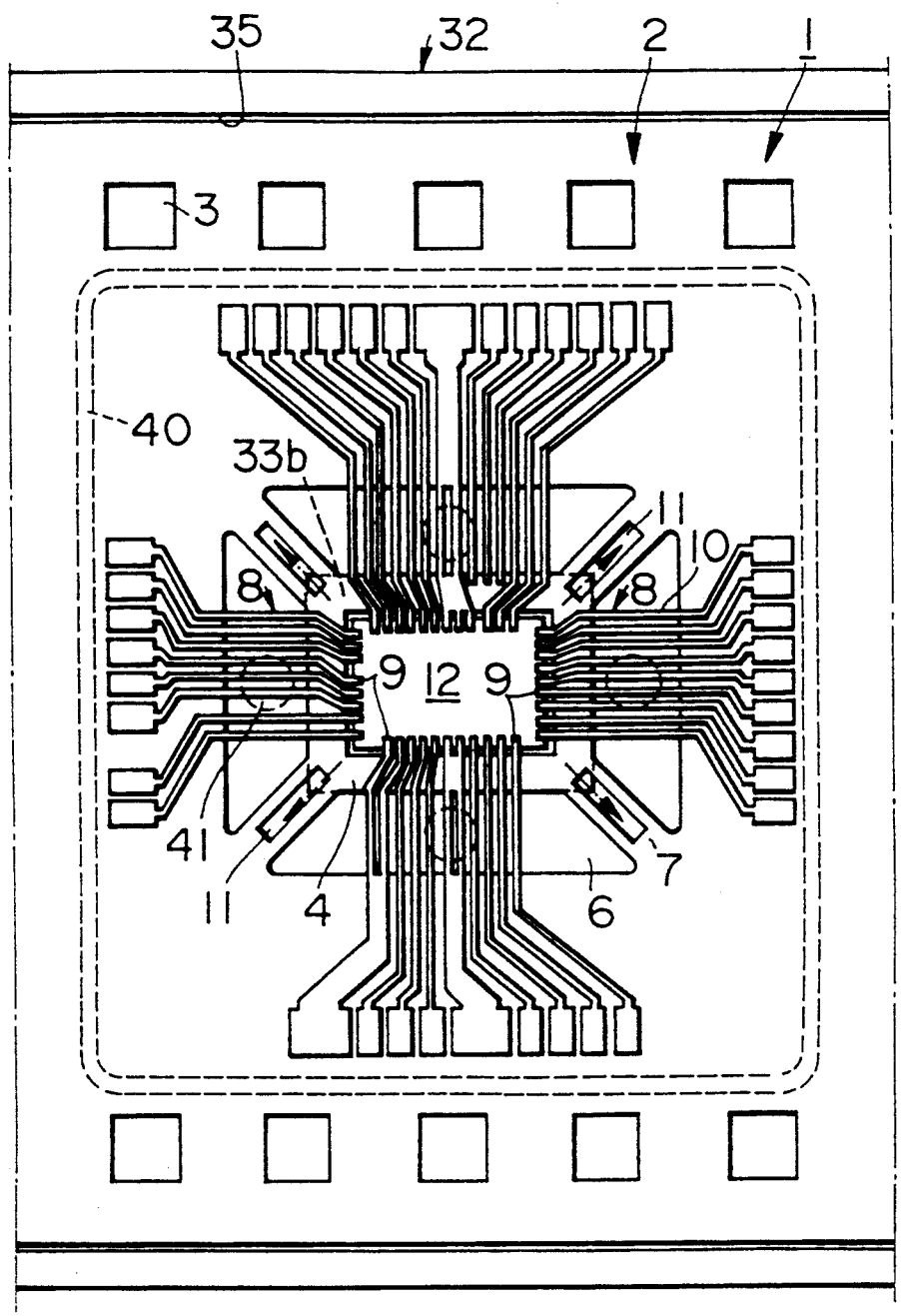
FIG. 7 is a partially omitted top plan view showing a portion of the package in the mold.

The carrier tape 2 is fitted in the relief recess 35 in the lower mold 32 and the individual chips 12 are fitted in the individual cavity recesses 33b of the lower mold 32, as shown in FIG. 7 and 8A.

Next, according to step 107 the solid compound sheets 20 are individually placed on the chips 12, as shown in FIG. 8, which can be executed automatically and altogether by a suitable handling apparatus.

Subsequently, according to step 108 as shown in FIG. 8B, the upper and lower molds 31 and 32 are clamped to form the individual cavities 33. As a result, the chips 12, the inner leads 9 of the individual leads 8, and the upper and lower solid compound sheets 20 are in the individual cavities 33, and the support ring 4 has its outer peripheral edges clamped between the upper and lower molds 31 and 32.

When the individual cavities 33 are sealed by the upper and lower molds 31 and 32, and evacuated by step 109 the solid compound sheets 20 in the individual cavities 33 are heated to predetermined temperatures (e.g., 150° C. to 190° C.) by the heaters 34 and melted into a liquid molding material 45 having an increased volume, as shown in FIGS. 9 and 10 for step 110. The liquid molding material 45 expands and fills the inside of the cavities 33. Since the filling liquid molding material 45 has its volume restricted by the cavities 33, the relatively expanded liquid molding material 45 is pressure molded. Excess of the pressure-molded liquid molding material 45 is extruded in a self-controlled manner by its own pressure into the individual relief passage sumps 11 of the TAB tape 1, as indicated by double-dotted arrows in FIG. 7. Since the liquid molding material 45 is pressure relieved into the sumps 11, this material 45 can be prevented from leaking from the gap between adjoining leads 8. Thus, resin flash can be eliminated.

In the present embodiment, the cavity 33 is not charged with the liquid molding material 45 from the outside of the cavity 33 but is filled up with the compound sheet 20, which is then melted therein. Thus, the liquid molding material 45 is not transferred from outside of the cavity 33. Moreover, the liquid molding material 45 hardly moves in the cavity 33.

Even in case an extremely thin resin-sealed package having a thickness about two times as large as that of the chip 12 is to be molded, the liquid molding material 45 in the cavity 33 receives less heat from the heaters 34 than that the transfer friction generated heat of the case of the conventional transfer molding, so that viscosity is not increased to a high level with the present invention.

As a result, the liquid molding material 45 in the cavity 33 keeps its preset viscosity and hardly moves in the cavity 33. Thus, it is possible to prevent the connecting terminals 17 from being deformed by the liquid molding material 45 taking a high viscosity, the chip 12 connected mechanically with the leads 8 from being loosely moved, and the liquid molding material 45 from being left partially uncharged.

On the other hand, the liquid molding material 45 in the cavity 33 keeps the preset viscosity, so that its viscosity is set to optimum value. Thus and due to leakage to sumps 11, the liquid molding material 45 can be prevented from leaking to the outside of the cavity 33 from the gap between the adjoining leads 8 to eliminate any resin flash.

Moreover, since the properties such as the viscosity of the liquid molding material 45 can be determined depending upon the composition of the compound sheet 20 before being liquidized and since the liquid molding material 45 in the cavity 33 keeps its preset viscosity, the degree of freedom for designing the composition of the compound sheet 20 can be enhanced. This makes it possible to use resin or the like exhibiting high functions as the main component, to select additives freely, and to enhance a variety of performances such as the humidity resistance or the mechanical strength of the molded resin-sealed package 46.

The liquid molding material 45 heated, as described above, is set to the solid molding material by its thermal cross-linking reaction, according to the step 111, to obtain solid molding material that constitutes the molding of the resin-sealed package 46.

Figure 11:
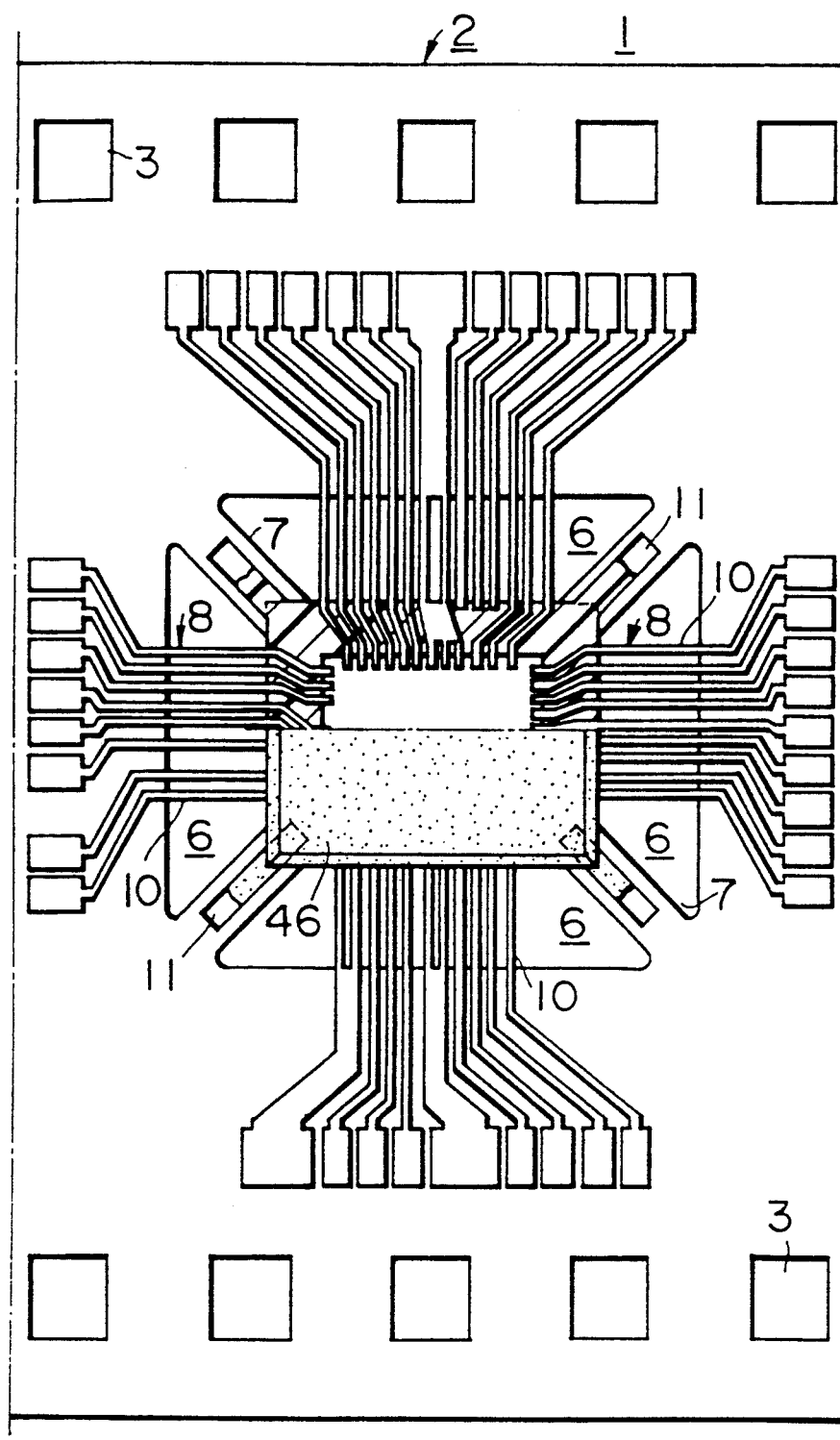
FIG. 11 is a partially omitted, partially sectional, top plan view of the molded resin-sealed package.

When the resin-sealed package 46 is molded, the upper and lower molds 31 and 32 are opened according to step 112, and the grouped resin-sealed packages 46 are parted by means of ejector pins (although not shown). Thus, the TAB tape 1 having the resin-sealed package 46 molded, as shown in FIG. 11, is dismounted from the transferless resin-sealed package molding apparatus 30.

In the resin-sealed package 46, there are the chip 12, the individual inner leads 9 of the grouped leads 8, and the support ring 4. In this state, the grouped leads 8 have their outer leads 10 projected generally at a right angle from the sides of the resin-sealed package 46.

In order to improve the filling of the cavity 33 with the liquid molding material 45, the cavity 33 has to be evacuated (step 109) so as to permit the liquid molding material 45 to expanded.

Since the molding compound sheet 20 has the convex second principal face 20b, the cavity 33 is filled from its central portion with the liquid molding material 45, as shown in FIG. 9, when the molding compound sheet 20 starts to melt. This filling procedure gradually advances to the peripheral portion and the air 47 in the cavity 33 is relatively extruded from the central portion to the peripheral portion by the liquid molding material 45 until it is discharged from the minute gap 48 between the adjoining leads 8 in the peripheral portion of the cavity 33. At this time, the liquid molding material 45 acts, as shown in FIG. 9, to discharge all the air 47 from the inside of the cavity 33. Thus, it is possible to prevent an uncharged portion from being formed in the molded resin-sealed package 46.

When the liquid molding material 45 starts to expand in the cavity 33, as shown in FIG. 10, the air 47 in the cavity 33 is extruded to leak from the minute gap 48, which is formed between the clamping flanges 36a, 36b of the upper and lower molds 31, 32 and the adjoining leads 8, to the space 38 formed by the clamping flanges 37a, 37b. The leaked air 47 flows to the air sump 42 by way of the air passage 41. At this time, the cavity 33 is evacuated when the volume of the air sump 42 is forcibly increased by retraction of the plunger 43.

The pressure molded resin-sealed package 46 has its external shape regulated to a predetermined accuracy by the internal shape of the cavity 33, as the resin density rises.

If the leakage of the air 47 from the gap 48 is allowed unlimitedly even after the complete charge of the cavity 33 with the liquid molding material 45, this material 45 in the cavity flows out of the gap 48 to leave resin flash in the molded resin-sealed package 46. In the present embodiment, however, the seal rings 40 are sandwiched between mating faces of the upper and lower molds 31, 32 and the carrier tape 2 so that the air 47 is sealed in the air sump 42, the air passage 41 and the space 38 when the cavity 33 is filled up with the liquid molding material 45. Thus, the liquid molding material 45, which fills up the cavity 33 and flows out of the aforementioned gap 48, is blocked from flow out by the pressure of the sealed air 47 so that resin flash is prevented. Specifically, the capacity of the air sump 42, the air passage 41 and the space 38 is so set that the pressure of the air 47 balances the force for the liquid molding material 45 tending to leak from the cavity 33 when the cavity 33 is filled up with the liquid molding material 45. The sealed air 47 pressurize inward at the peripheral edge of the cavity 33 so that it confines the liquid molding material 45 in the cavity 33 all over the periphery.

The surface-mounted type resin-sealed package IC 49 having the molded resin-sealed package 46 is shipped in step 114 after testing step 113 to test electric characteristics while being attached to the TAB tape 1 as shown in FIG. 11.

Then, the surface-mounted type resin-sealed package IC 49 is arranged on a printed circuit board 51, as shown in FIG. 12, such that it is attached to the TAB tape 1 or that it is cut outside of the resin-sealed package 46 and individually separated. The resin-sealed package IC 49 is subjected to a reflow soldering treatment between the outer leads 10 and lead pads 52. At this time, the solderability is excellent since the leads 8 have their surfaces plated with tin films.

The following effects can be obtained according to the embodiment thus far described: Since the resin-sealed package 46 is molded such that the molding material 45 is confined in the cavity 33, the density of the molding material 45 in the molded resin-sealed package 46 is as high as that of the molding material in the resin-sealed package according to the transfer molding process. As a result, the resin-sealed package 46 has excellent reliabilities in humidity resistance and mechanical strength. Since the resin-sealed package 46 has its external shape regulated by the cavity 33, its external size is highly accurate.

The cavity 33 is not charged with liquid molding material 45 fed from the outside, but with the liquid molding material 45 prepared by melting the molding compound sheet 20 fed in advance to the inside of the cavity 33. As a result, the liquid molding material 45 is not transfer friction heated or prematurely heated by the mold. As a result, the liquid molding material 45 in the cavity 33 keeps its preset viscosity and is hardly moved in the cavity 33. Thus, it is possible to prevent the connecting terminals 17 from being deformed by the liquid molding material 45 taking a high viscosity, relatively moving the chip 12 mechanically connected with the grouped leads 8, and the molding material 45 from being partially uncharged. The liquid molding material 45 in the cavity 33 keeps the its preset viscosity so that its viscosity is set to its optimum value. Thus, the liquid molding material 45 can be prevented from leaking to the outside of the cavity 33 from the gap between the adjoining leads 8 to eliminate any resin flash. The viscosity and the properties of the molded material can be determined depending upon the composition of the compound sheet 20 before it is liquidized and since the liquid molding material 45 in the cavity 33 keeps its preset viscosity, the degree of freedom for designing the composition of the compound sheet 20 can be enhanced. This makes it possible to use the resin or the like exhibiting high functions as the main component, to select additives freely, and to enhance a variety of performances such as the humidity resistance or the mechanical strength of the molded resin-sealed package 46.

Since the chip 12 is tape-automated-bonded to the grouped leads 8, the device thinning and pin multiplying are promoted, to enhance packageability and productivity, and to reduce the price. Satisfactory sealing performance and reinforcement of the outer leads 10 with the resin-sealed package 46 enhances the strength of the outer leads 10.

Figure 14:
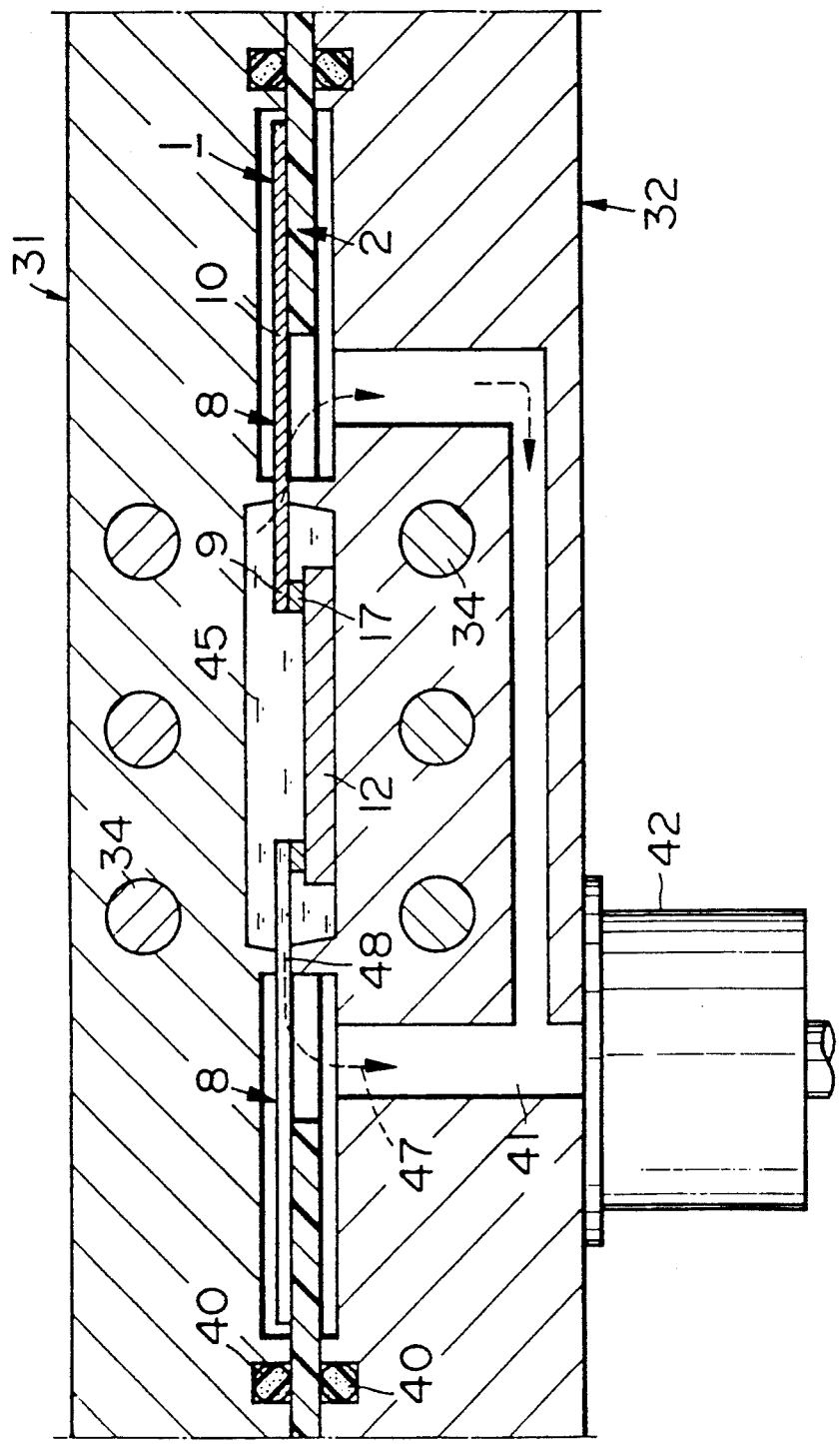
Figure 15A:
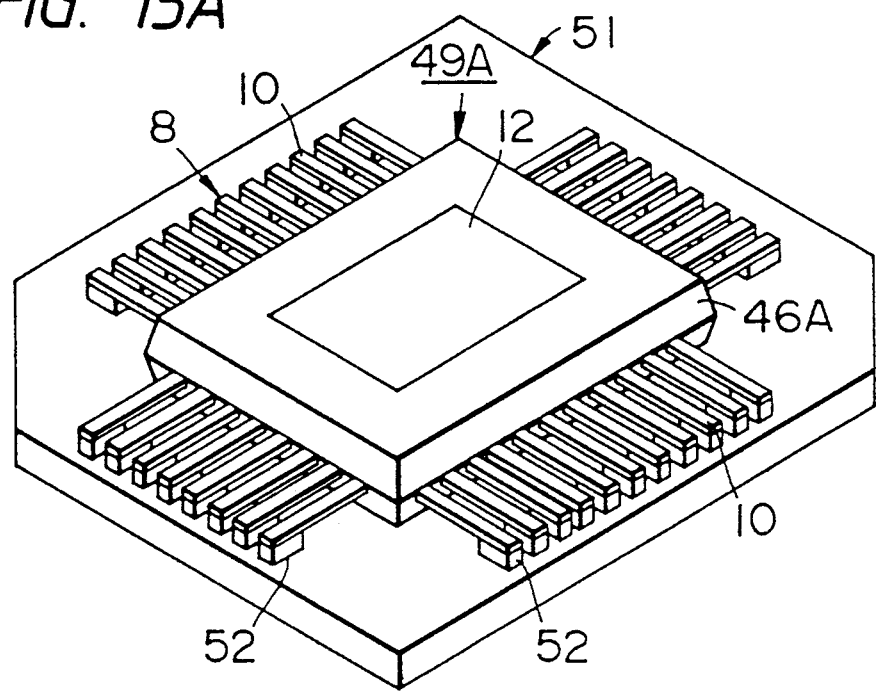
FIGS. 15a and 15b present a partially omitted perspective view and a partially cut-away front elevation of the embodiment 2.
Figure 15B:
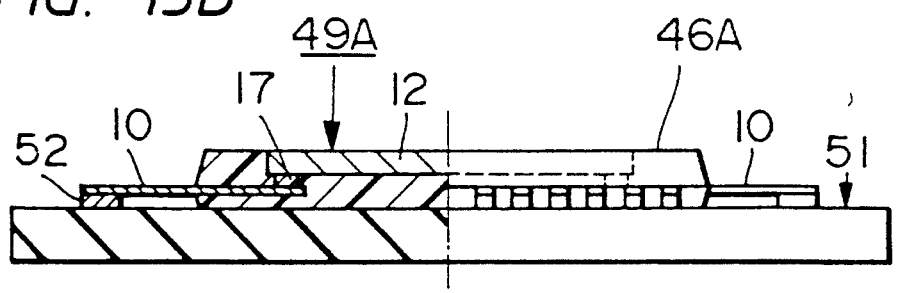

FIGS. 13 and 14 show steps of molding according to an embodiment 2 and correspond to FIGS. 9 and 10 of the foregoing embodiment 1. FIGS. 15A and 15B are a perspective view and a partially cut-away front elevation showing the packaged embodiment 2.

The embodiment 2 is different from embodiment 1 in that: support rings are omitted from a TAB tape IA; a lower mold cavity recess 33B is so shallow as to have its one end face exposed in a transferless resin-sealed package molding apparatus 30A; and a semi-fluid molding material 20A is applied in advance (in place of the molding compound sheet 20) as the solid molding material to the TAB tape IA by suitable means such as screen printing. Specifically, the support rings are not disposed outside of the chip 12 in the TAB tape IA as shown in FIGS. 13 and 14. As shown in FIG. 14, the chip 12 has one end face abutting against the bottom face of the lower mold cavity recess 33B. As shown in FIG. 13, the semi-fluid molding material 20A is applied to the periphery of the chip 12.

In the present embodiment 2, effects similar to those of the foregoing embodiment 1 can be attained since the semi-fluid molding material 20A is confined in cavity 33A.

As shown in FIGS. 15A and 15B the principal face of the chip 12 opposed to the inner bonding side is exposed from a resin-sealed package 46A so that this package 46A can be accordingly thinned and to attain another effect that heat radiation is improved according.

The present embodiment 3 of FIGS. 16-19 is different from the foregoing embodiment 1: in that the support rings are omitted from a TAB tape IB; in that a dam tape 4B for preventing the liquid molding material 45 from flowing out is adhered to the boundary between the inner leads 9 and outer leads 10 in the grouped leads 8; and in that an air passage 41B in a transferless resin-sealed package molding apparatus 30B is connected directly in fluid communication with the inside of the cavity 33.

Next, the process for molding the resin-sealed package forming a major portion of the present embodiment 3 by using the TAB tape IB and transferless resin-sealed package molding apparatus 30B thus constructed will be described in the following while stressing the points different from the foregoing embodiment 1.

Figure 17:
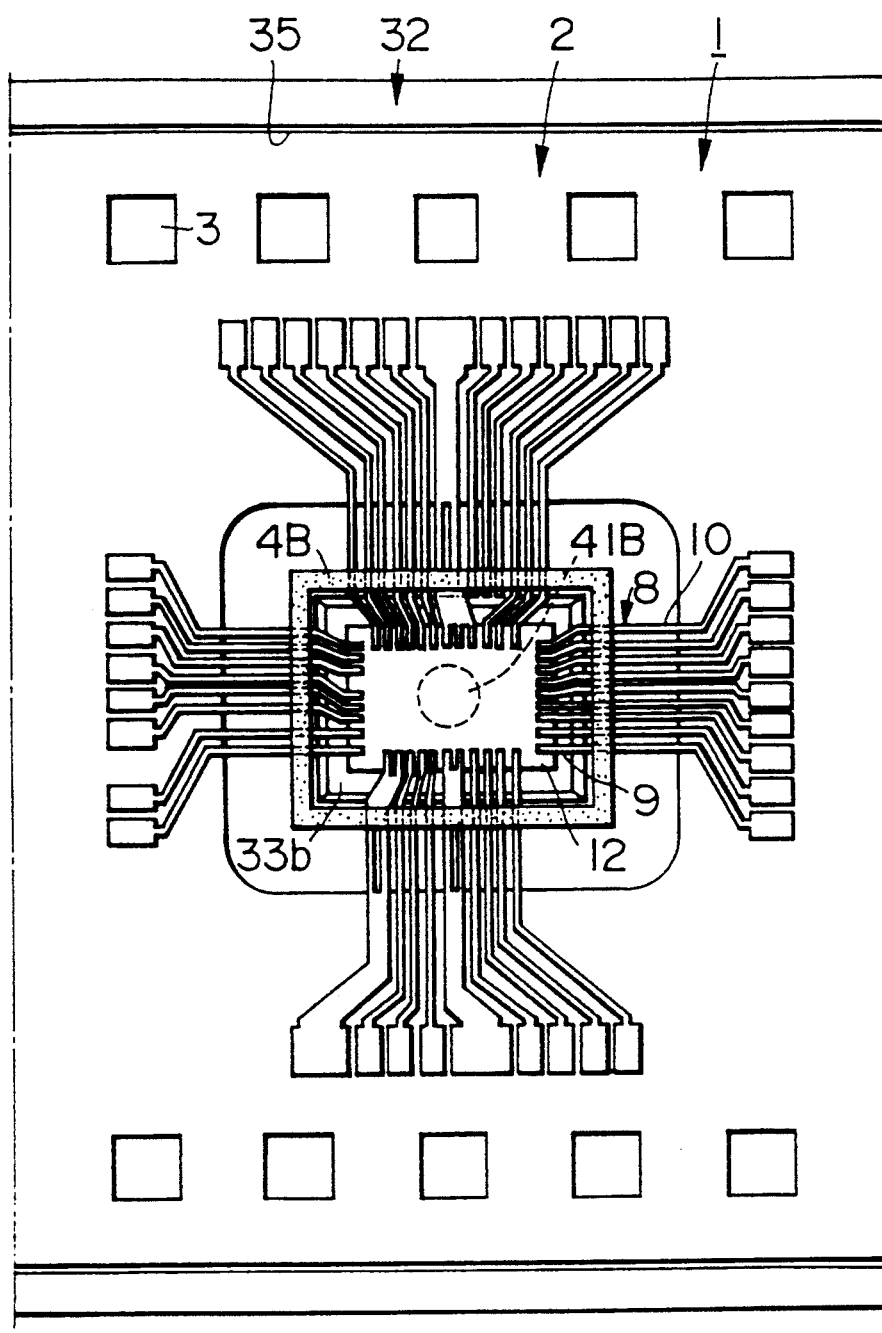
Figure 18:
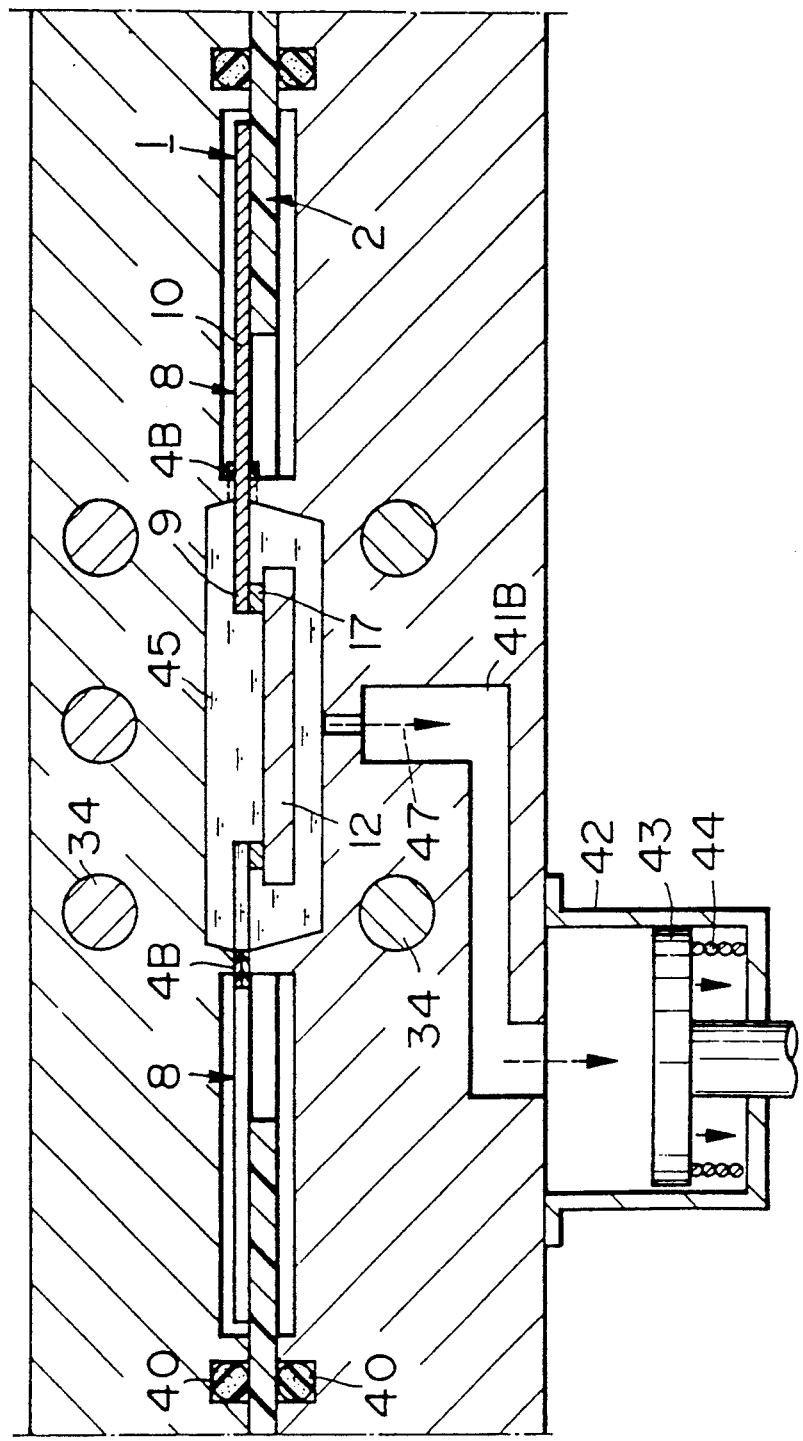
Figure 19:
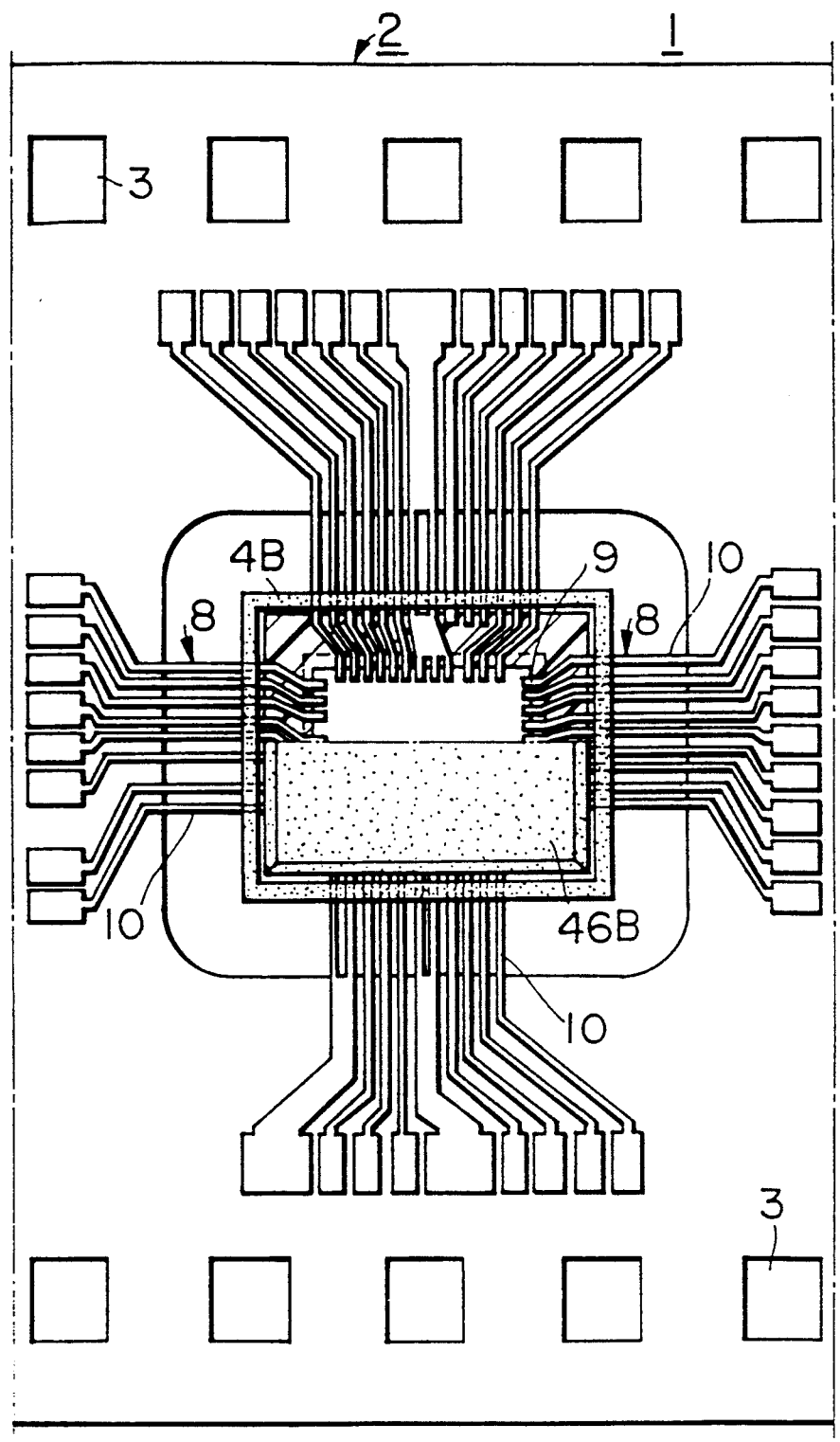
FIG. 19 is a partially omitted, partially cutaway top plan view of the third embodiment package.

The individual cavities 33 in the upper and lower molds 31 and 32 have their outer peripheral edges corresponding to the inner peripheral edges of the dam tape 4B adhered to the TAB tape IB, as shown in FIGS. 17 and 18. Carrier tape 2 is mounted in the relief recess 35 formed in the lower mold 32 and each chip 12 is mounted in each cavity recess 33b of the lower mold 32.

When the individual cavities 33 are sealed by the upper and lower molds 31 and 32, the solid compound sheets 20 in the individual cavities 33 are individually heated to a predetermined temperature (e.g., 150° C. to 190° C.) by the heaters 34. The compound sheets 20 are melted into the liquid molding material 45 while being expanded, as shown in FIG. 18. As the volume increases, the liquid molding material 45 fills the cavities 33. At this time, the full liquid molding material 45 is restricted from its further expansion by the cavities 33 so that the relatively expanded liquid molding material 45 is pressure-molded by the cavities 33.

During this pressure-molding, the liquid molding material 45 will leak from the gap 48 between the adjoining leads 8. Since the tape 4B acting as the dam is between the individual leads 8 along the outer peripheral edges of the cavities 33, the liquid molding material 45 is prevented from leaking from the gap 48 between those leads 8. As a result, no resin flash is formed. As compared to the prior art, less viscous liquid molding material can be used as resin flash is better prevented. If the liquid molding material has a lower viscosity, its flow into a micro space can be improved to thin the resin sealed package more. The damming tape 4B is removed at the shipping time.

To assure that the cavities 33 may be filled with the liquid molding material 45, the cavities 33 are evacuated to discharge air 47 so as to exert no obstruction against the expansion of the liquid molding material 45. In FIG. 18, the air 47 in the cavities 33 is expelled to the air passage 41B which is connected in fluid communication with the cavities 33, when the liquid molding material 45 begins to expand in the cavities 33. The expelled air 47 flows into the air sump 42 by way of the air passage 41B. If, at this time, the volume of the air sump 42 is forcibly increased as the plunger 43 is retracted, the cavities 33 are evacuated.

Figure 6:
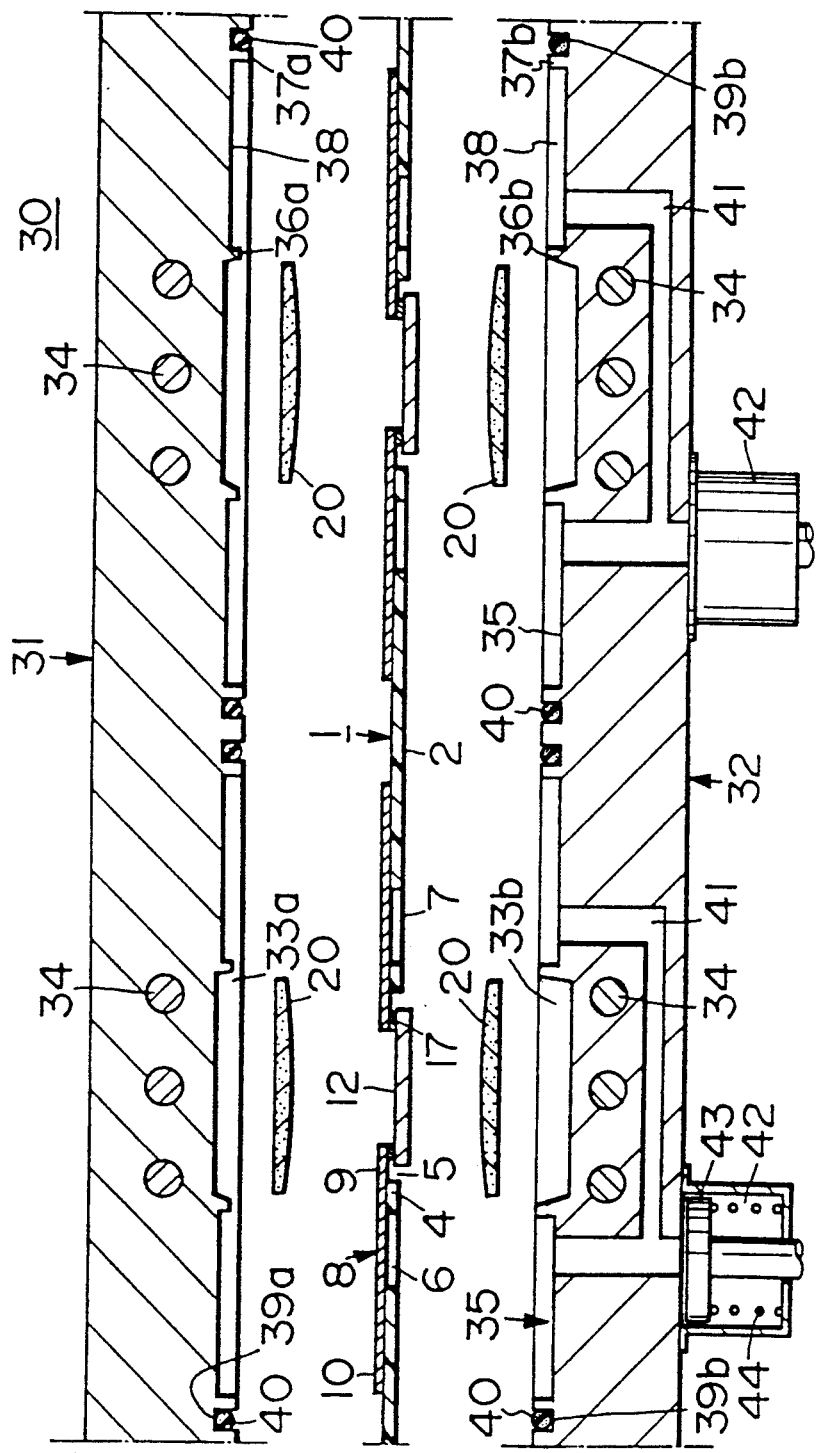
FIG. 6 is a partially omitted, exploded, sectional, front elevation showing molding a resin-sealed package or an essential portion of the semiconductor integrated circuit.
Figure 20:
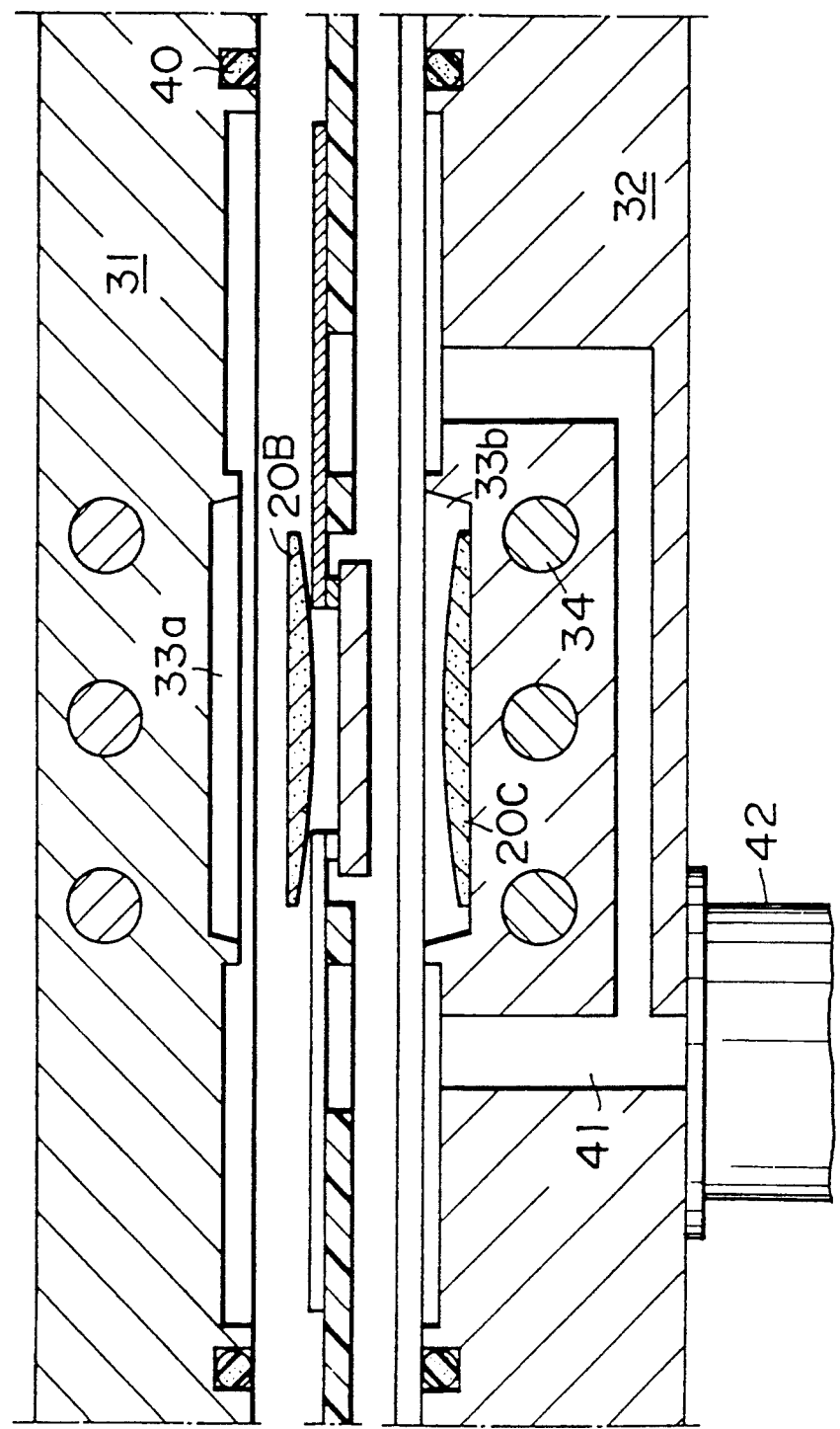

FIGS. 20 and 21 correspond to FIGS. 6 and 9, but are for an embodiment 4. FIGS. 22A and 22B are sectional front elevations individually showing two kinds of embodiment 4 surface-mounted type resin-sealed package ICs.

Embodiment 4 is different from the foregoing embodiment 1 in that the two compound sheets 20B and 20C to be individually mounted in the cavity recesses 33a, 33b are of different compositions, so that a liquid molding material 45B for forming an area at the side of the grouped connecting terminals 17 and a liquid molding material 45C for forming an area at the opposite side have different properties in the resin-molded package. In FIG. 22A, area Ca at the side of the grouped connecting terminals 17 is molded of a molding material (i.e., a low stress resin) having its stress reduced after it has been set, whereas the remaining area Cb is molded of a molding material exhibiting a high thermal conductivity and/or a high mechanical strength after it has been set. In FIG. 22B, area Da at the side of the grouped connecting terminals 17 is molded of a molding material exhibiting viscosity reduction while it is being melted, whereas the remaining area Db is molded of a molding material exhibiting increasing viscosity while it is being melted.

Embodiment 5 is different from the foregoing embodiment 1: in that it is IC having a quad flat I-lead package ("QFI- IC") in that a multiple row lead frame is used in place of the TAB tape such that the chip is bonded to the inner leads in each unit lead frame and such that wires are bridged between the individual inner leads and the chip; in that there is used a molding compound sheet capable of interference with the bonding wires; and in that the air passage in the transferless resin-sealed package molding apparatus is directly connected in fluid communication with the inside of the cavity.

Figure 25:
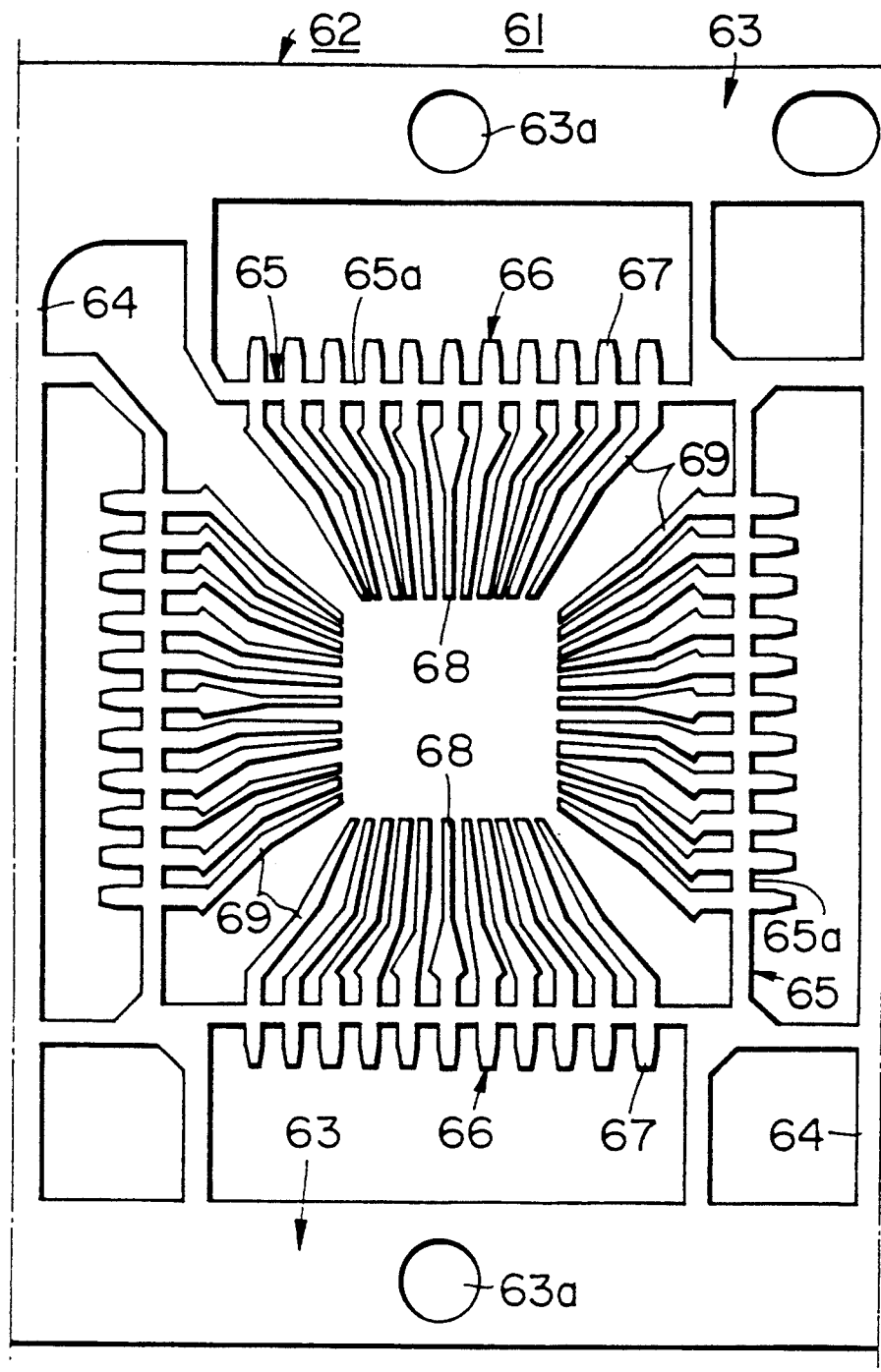
FIG. 25 is a partially omitted top plan view showing a multiple row lead frame according to embodiment 5.

Specifically, a multiple row lead frame 61 shown in FIG. 25, is integrally shaped by punching or etching using a thin sheet (having a thickness of 0.25 mm, for example) which is made of an iron (or its alloy) material such as a 42 alloy or Kovar, or a copper (or its alloy) material such as phospor bronze or oxygen-free copper. A plurality of unit lead frames 62 are juxtaposed in a row in one direction on multiple row lead frame 61. However, the description and illustration will be made for only one unit.

The unit lead frame 62 is equipped with a pair of outer frames 63 having positioning holes 63a. These outer frames 63 are individually extended in a row and in parallel at a predetermined interval. Between the adjoining unit lead frames 62, there are a pair of section frames 64 extended in parallel integrally across and between the two outer frames 63. The unit lead frame 62 is a generally rectangular frame defined by outer frames and section frames.

In each unit lead frame 62, the two outer frames 63 and the two section frames 64 are arranged with four dam members 65 in a generally square frame shape and in an integrally bridging manner. Each dam member 65 is arranged at a longitudinally equal distance with a plurality of leads 66 which are integrally projected at a right angle with respect to the dam member 65 while holding an insulating gap inbetween. The portion in the dam member 65 between the adjoining leads 66 substantially constitutes a dam 65a for blocking the flow of the liquid molding material 45 at the time of molding.

Since the individual leads 66 have their outer side portions projected to the outside of the resin-sealed package, they individual constitute outer leads 67 such that the individual outer leads 67 have their leading end portions cut away from the individual outer frames 63 and the section frames 64. The individual leads 66 have their inner side portions confined in the resin-sealed package so that they constitute inner leads 68 individually. Moreover, the inner end portions or the substantial extensions of the individual inner leads 68 are arrayed on one straight line extending the predetermined positions of the individual sides in the recess of the unit lead frame 62. The intermediate portions of inner leads 68 are opposed to the bonding pads of the chip to constitute wiring bonding portions 69. The grouped inner leads 68 are wired to make use of the dead space in the central portion of the recesses of the unit lead frames 62 absolutely unlike the inner leads of the QFI-IC using the ordinary multiple row lead frame. In other words, the grouped inner leads 68 are individually arranged at their intermediate portions with the grouped wire bonding portions 69, which are arrayed on one line at predetermined positions. Moreover, the individual inner leads 68 have their leading ends extended more inside than the inner leads of the ordinary QFI-IC, and the chip is bonded to the leading end portions extended. As a result, the leading end portions of the grouped inner leads 68 are wired below the chip.

Figure 26A:
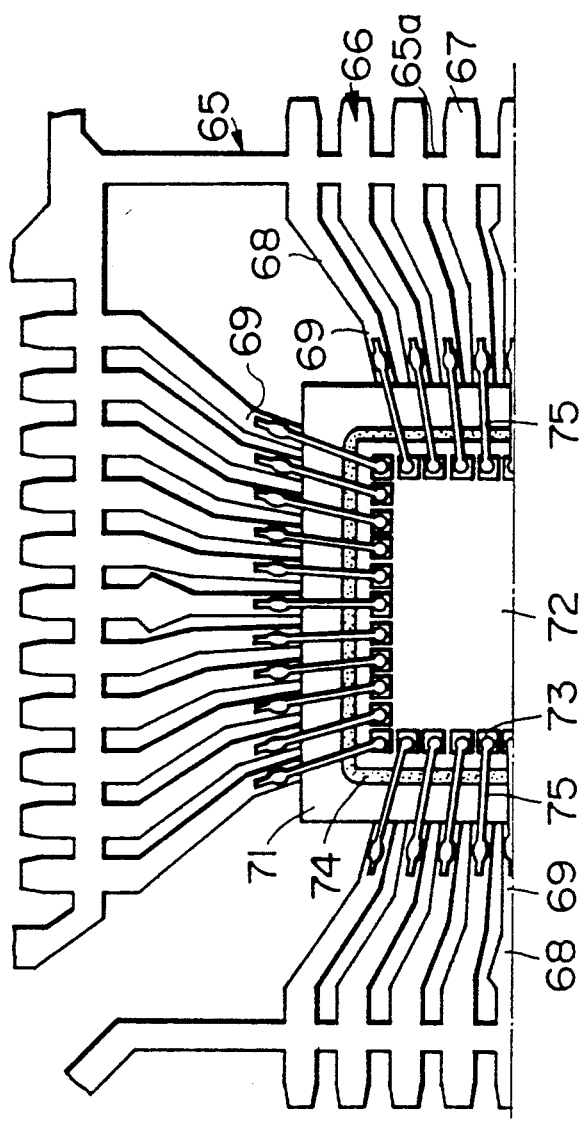
FIGS. 26a and 26b present a partially omitted, enlarged top plan view and an enlarged sectional front elevation after wire bonding according to embodiment 5.
Figure 26B:
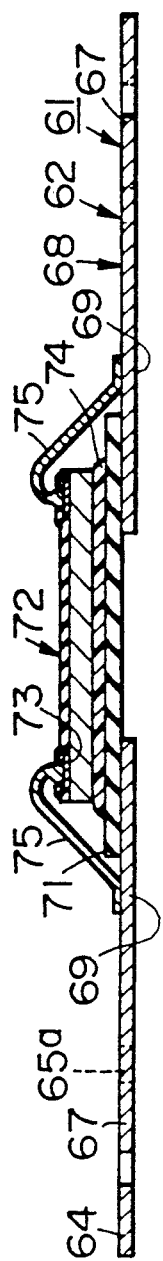

The multiple row lead frame 61 is subjected for each unit lead frame 62 to an insulating sheet bonding and a chip bonding, then a wiring bonding. These bonding treatments are sequentially executed for the individual unit lead frames 62 by feeding the multiple row lead frame 61 pitch by pitch in the series direction, to prepare an intermediate product, as shown in FIG. 26.

Next, the individual bonding treatments will be briefly described in the following. First of all, an insulating sheet 71 is adhered to the extending inner ends of the inner leads 68 in the unit lead frame 62 through a bonding layer (although not shown) of an adhesive. The insulating sheet 71 is made of a material having an excellent insulating property such as a polyimide resin film and formed into a rectangle larger than the top plan side of the chip having a thickness of about 125 microns from correlation between the maintenance of insulation and the mechanical strength. Moreover, the adhesive bonding layer can be a thermoplastic resin such as polyether amideimide or a thermostet resin such as epoxy.

Next, the chip 72 is bonded to the insulating sheet 71 in each unit leading frame 62 through a bonding layer 74 of Ag paste. At this time, the chip 72 is arranged generally concentrically with the insulating sheet 71. The adhesive used for forming the bonding layer 74 to fix the chip 72 on the insulating sheet 71 may be a material having a thermal conductivity as good as possible. The insulating sheet for forming the insulating layer between the chip 72 and the inner leads 68 may be an insulating material such as a ceramic substrate.

Moreover, a metal layer may be formed over the insulating sheet, and the chip may be bonded to that metal layer. Heat generated by the chip can be dissipated through the metal layer. In this case, an insulating resin may be formed on the back of a metal sheet by a suitable thick film forming technology such as a screen printing method or a spraying method so that the insulating layer and the metal layer may be integrated. The Ag pasge may be replaced by a gold-silicon eutectoid or a solder.

The sequences of bonding the chip and the metal layer, the metal layer and the insulating layer, and the insulating layer and the leads may be modified by bonding the metal layer to the chip in advance, by forming the insulating layer on the back of the metal layer and by bonding the insulating layer to the leads.

At the next wiring bonding, wires 75 have their two end portions bonded between electrode pads 73 of the chip 72 bonded to the insulating sheet 71 and the wire bonding portions 69 of the inner leads 68 in the unit lead frame 62 to bridge them. By this treatment, the integrated circuit packaged in the chip 72 is electrically led to the outside through the electrode pads 73, the wires 75, the inner leads 68 and the outer leads 67.

Figure 23:
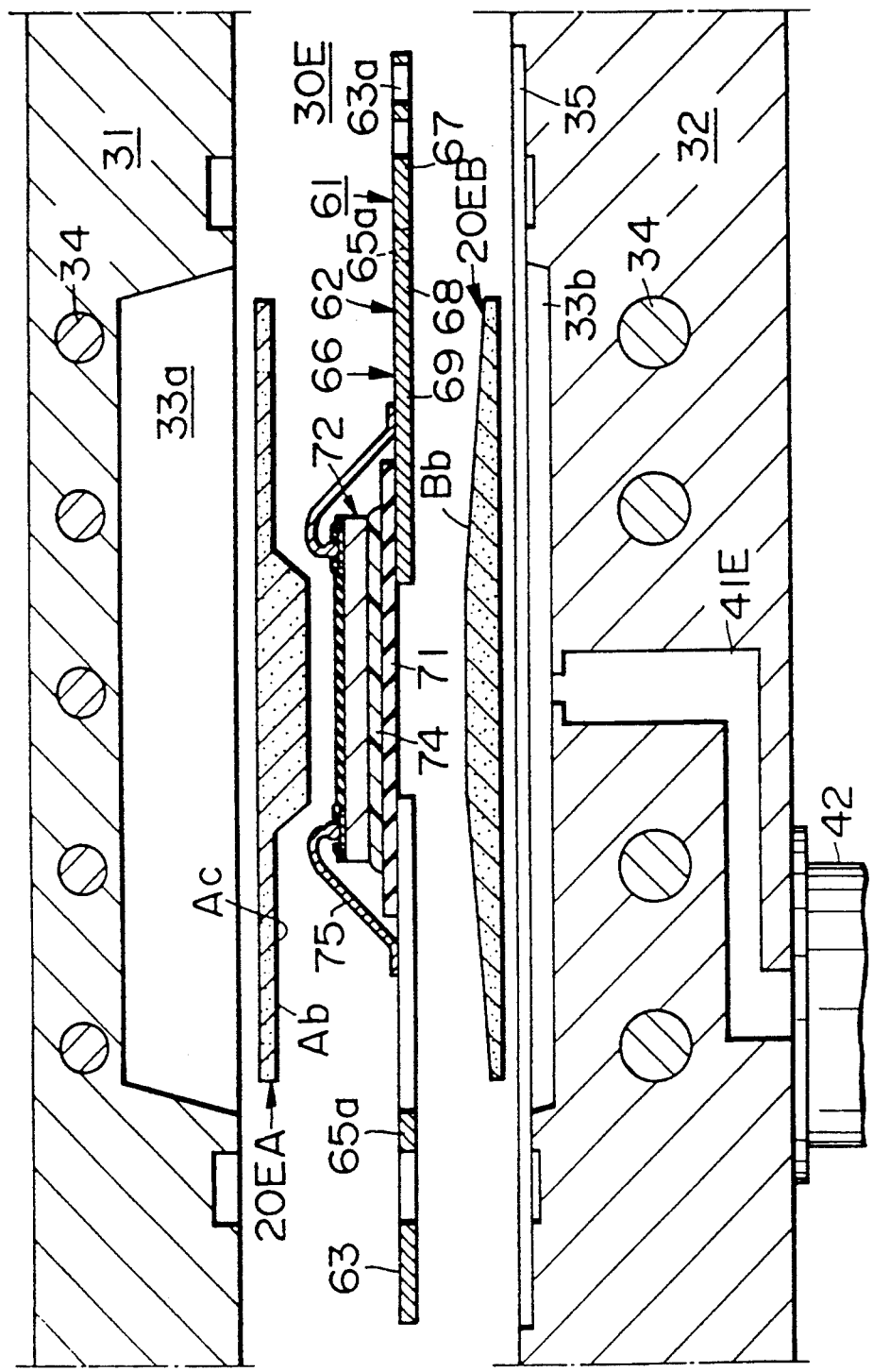
FIGS. 23 and 24 correspond to FIGS. 6 and 9 but of an embodiment 5 of the present invention.
Figure 24:
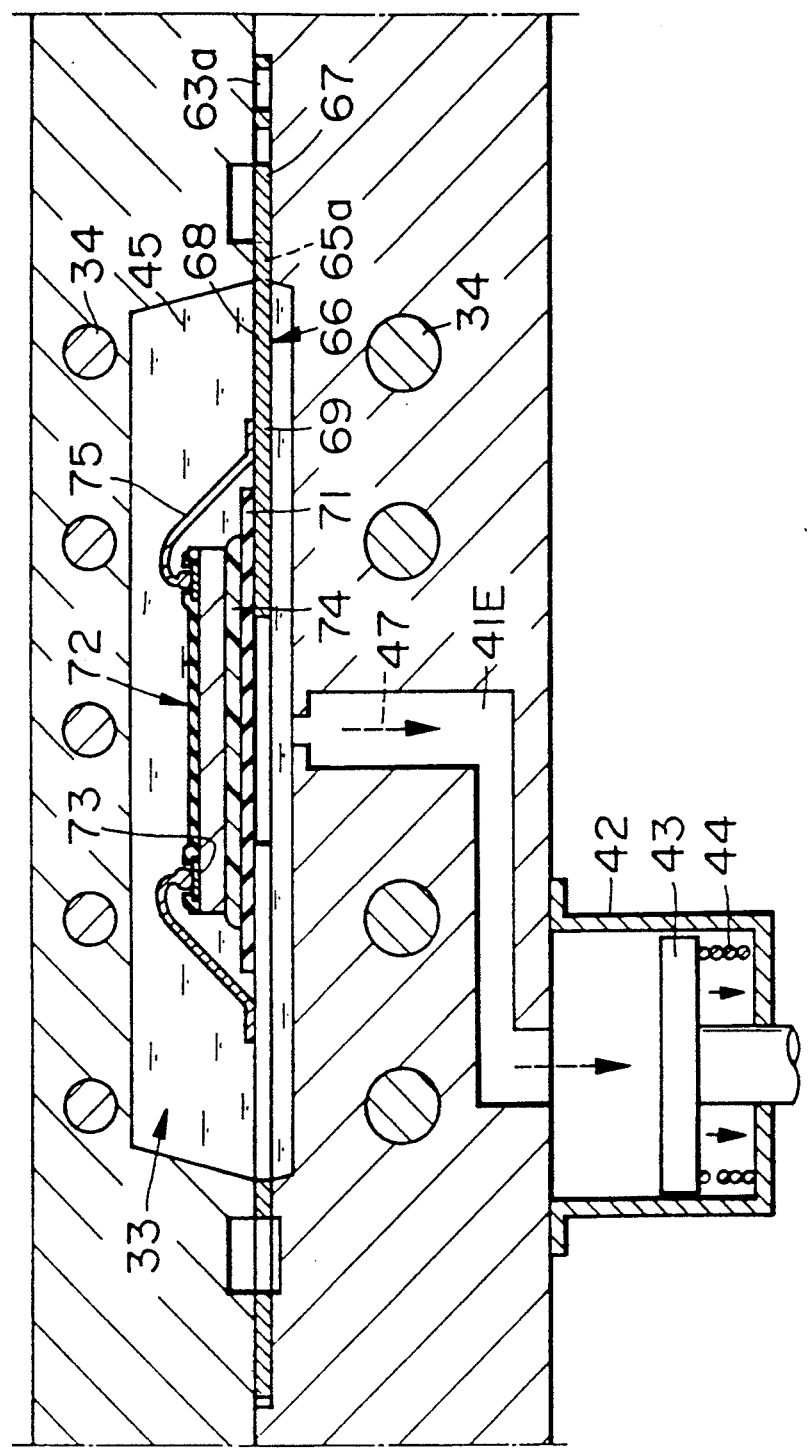
Figure 27:
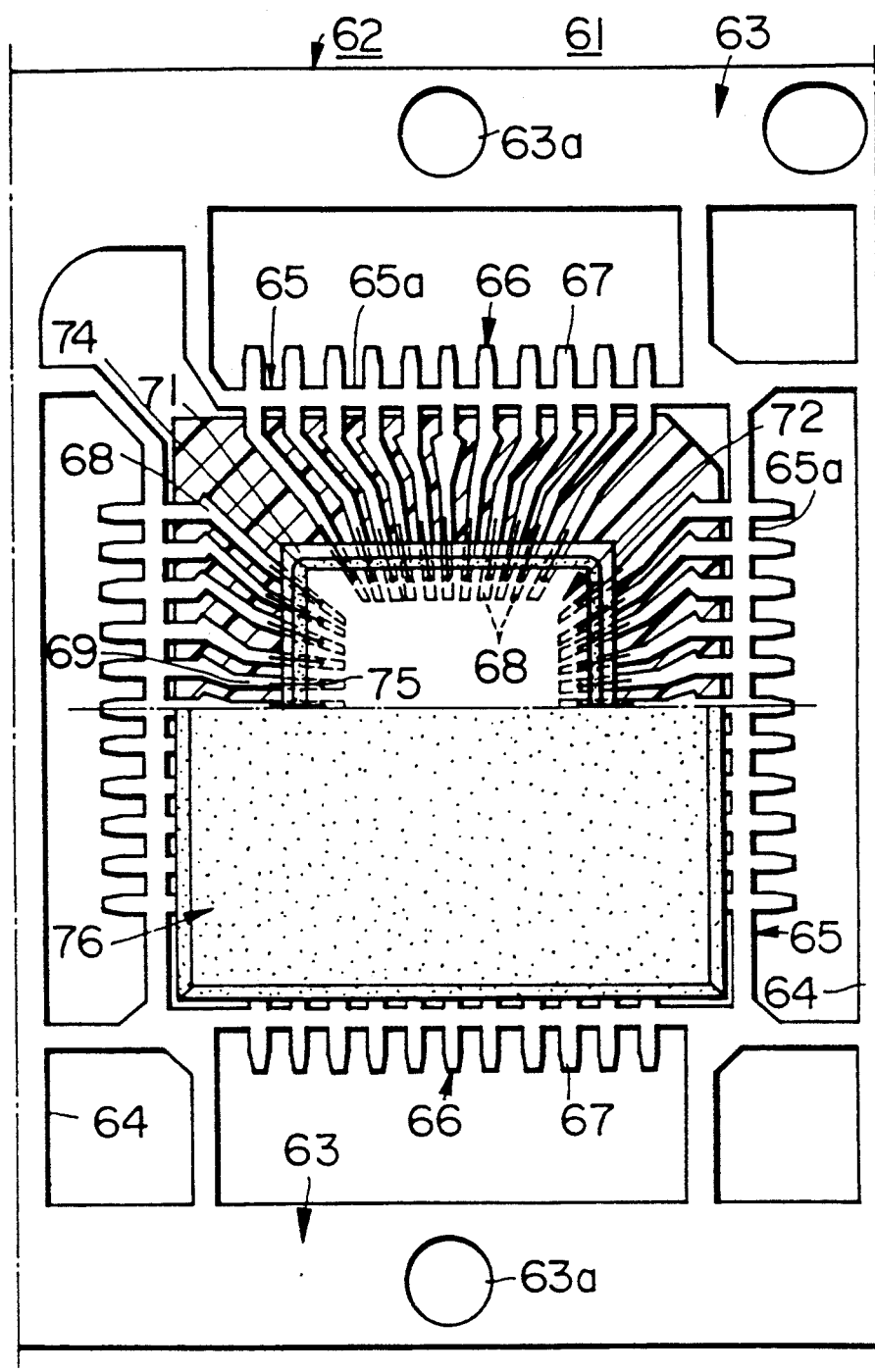
FIG. 27 is a partially omitted, partially cutaway front elevation after a resin-sealed package has been molded according to embodiment 5.

In the multiple row lead frame thus having the chip and wires bonded thereto, the resin-sealed package is molded for each unit lead frame by using the transferless resin-sealed package molding apparatus 30E, as shown in FIGS. 23 and 24. As shown in FIG. 27, moreover, the chip 72, the insulating sheet 71, the inner leads 68 and the bonding wires 75 are resin-sealed in the resin-sealed package 76.

The individual cavities 33 in the upper and lower molds 31 and 32 have their outer peripheral edges corresponding individually to the inner peripheral edges of the dam members 65 in the unit lead frame 62, as shown in FIGS. 23 and 24. A solid molding compound sheet 20EB is introduced at first into the cavity recess 33b of the lower mold 32 with its second principal convex face Bb being directed upward. The multiple row lead frame 61 is set in the relief recess 35 in the lower mold 32, such that the chips 72 are individually mounted in the individually cavity recesses 33b.

Next, a solid molding compound sheet 20EA is placed on the individual chips 72, as shown in FIG. 23, with its second principal convex face Ab being directed downward. Here, the convex face Ab is angled largely in the outer peripheral portion to form a recess Ac for relieving the bonding wires 75 of the chip 72.

Subsequently, the individual cavities 33 are formed by clamping the upper mold 31 and the lower mold 32, as shown in FIG. 24. As a result, there are mounted in the individual cavities 33 the chip 72, the inner leads 68 of the individual leads 66, and the upper and lower solid compound sheets 20EA and 20EB, and the dam members 65 of the individual leads 66 are sandwiched between the upper and lower molds 31 and 32. The solid compound sheet 20EA is prevented from having its outer peripheral portion interfering with the bonding wires 75 of the chip 72. As a result, the wires 75 are freed from being deformed by the upper compound sheet 20EA.

When the individual cavities 33 are sealed by the upper and lower molds 31 and 32, the upper and lower solid molding compound sheets 20EA and 20EB therein are individually heated to predetermined temperatures (e.g., 150° C. to 190° C.) by the heaters 34 and are melted into the liquid molding material 45 to have an expanded volume, as shown in FIG. 24, and fill the insides of the cavities 33. Since, at this time, the filling liquid molding material 45 is restricted from further expansion by the cavities 33, the relatively expanding liquid molding material 45 is pressure-molded by the cavities 33. At this pressure-molding time, the liquid molding material 45 will leak from the gap between the adjoining leads 66 but is prevented from leaking along the outer peripheral edges of the cavities 33 so that resin flash can be prevented.

In the embodiment 5, when the liquid molding material 45 starts to expand in the cavities 33, as shown in FIG. 24, the air 47 in the cavities 33 is expelled to an air passage 41E which is connected in fluid communication with the cavities 33. The air 47 thus expelled flows into the air sump 42 by way of the air passage 41E. If the volume of the air sump 42 is then forcibly increased by the retraction of the plunger 43, the cavities 33 are evacuated. Since the air 47 in the cavities 33 is thus discharged, the liquid molding material 45 in the cavities 33 is heated and expanded to fill up the cavities 33. The liquid molding material 45 is heated after it has filled up the inside of the cavities 33 and it is set into a solid molding material by its thermal cross-linking reaction to produce resin-sealed package 76.

The upper and lower molds 31 and 32 are opened, and the grouped resin-sealed packages 76 are parted by the (not-shown) ejector pins. Thus, the multiple row lead frame 61 having the grouped resin-sealed packages 76 molded, as shown in FIG. 27, is from the transferless resin-sealed package molding apparatus 30E.

Figure 28:
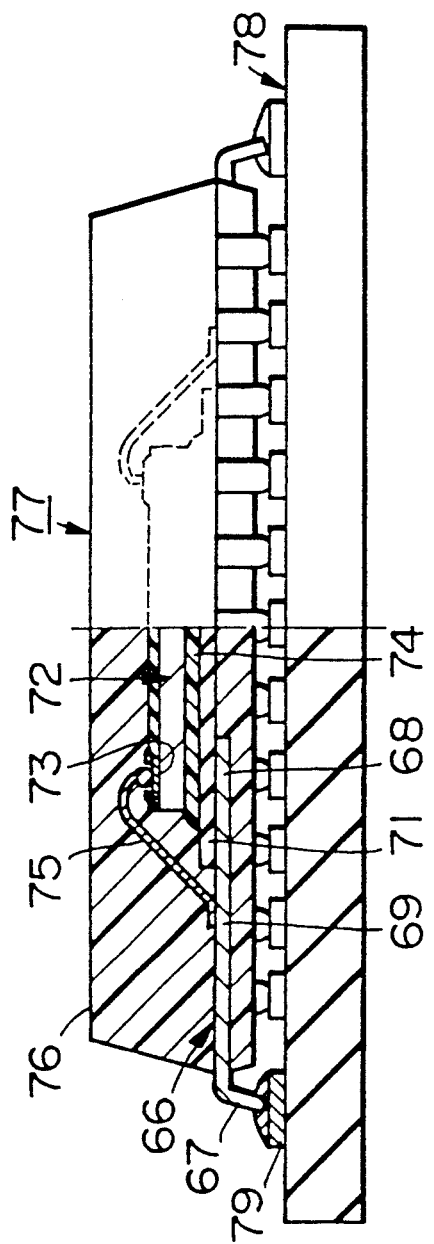
FIG. 28 is a partially cut-away front elevation showing a packaged state according to embodiment 5.

After this, the multiple row lead frame 61 has its outer frame 63, section frame 64 and grouped dams 65a cut away for each unit lead frame 62, and the outer leads 67 are bent downward into a lid shape, as shown in FIG. 28.

The QFP- IC 77 thus prepared is arranged on a printed wiring substrate 78, as shown in FIG. 28, and the outer leads 67 having the lid shape and land pads 79 are subjected to a reflow soldering treatment.

According to the present embodiment 5, the following effects can be achieved in addition to those of the foregoing embodiment 1: By wiring at least a portion of the grouped inner leads 68 below the chip 72 in the resin-sealed package 76, it is possible to retain a sufficient wiring space for the grouped inner leads 68. As a result, the inner leads 76 can be properly wired in the resin-sealed package 76 even in case of a highly integrated semiconductor integrated circuit device. By submerging the annular recess Ac in the outer peripheral portion of the convex face Ab for relieving the bonding wires 75 of the chip 72, the solid compound sheet 20EA can have its outer peripheral portion prevented from interfering with the bonding wires 75 of the chip 72. As a result, it is possible to prevent the bonding wires 75 at the molding step from being deformed by the molding compound sheet 20EA.

Embodiment 6 of FIGS. 29 and 30 is different from the foregoing embodiment 1 in that: a chip 12F is formed at its outer peripheral portion with a step 18 for relieving the height of connecting terminals 17F and the thickness of the inner leads 9 so that the connecting terminals 17F are formed of the bumps and the inner leads 9 in the step 18; the height of the connecting terminals 17F and the thickness of the inner leads 9 can be relieved by the step 18 so that a resin-sealed package 46F can be formed to have an accordingly reduced thickness.

Figure 31:
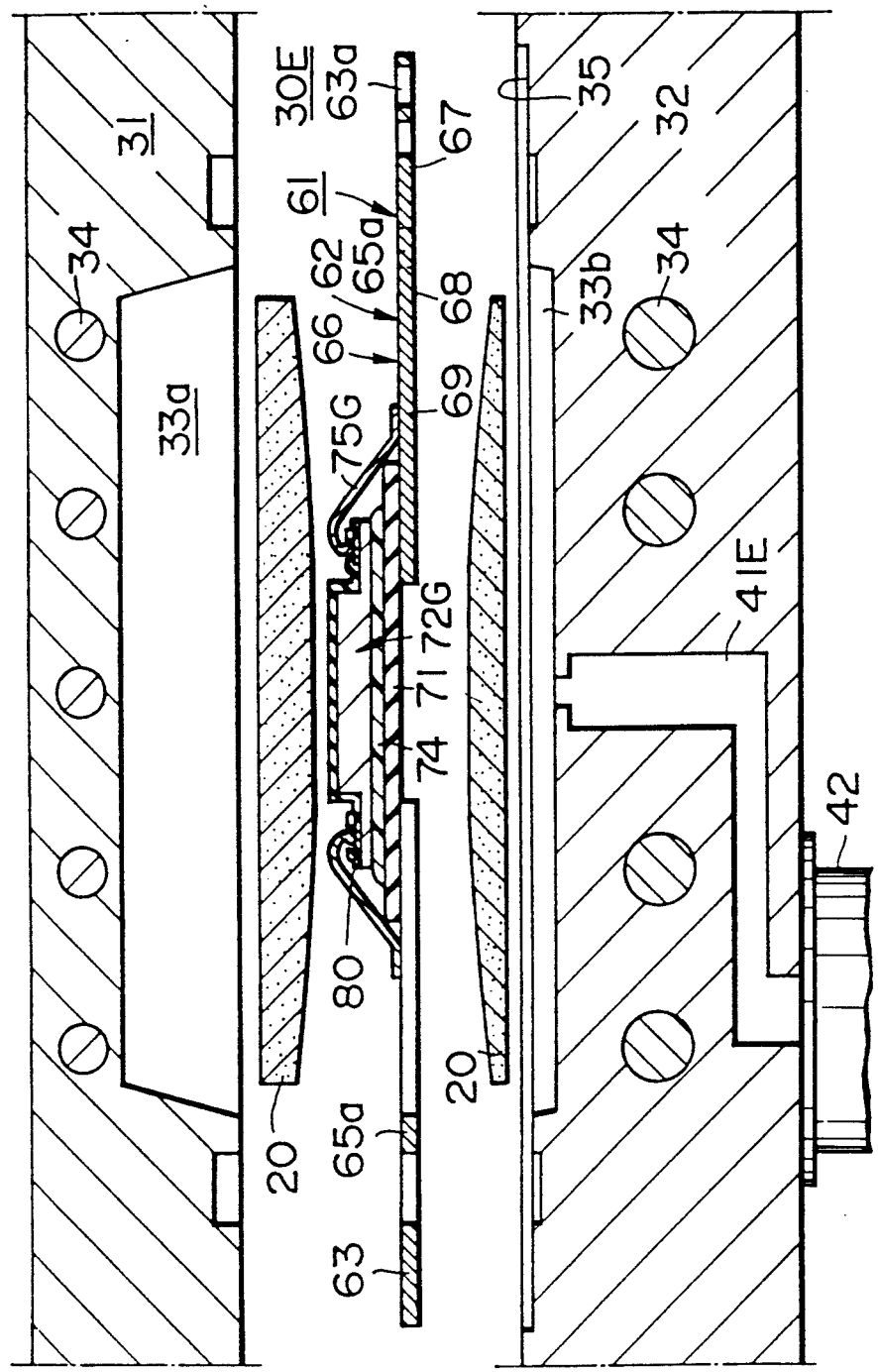
FIG. 31 is a partially omitted, enlarged and exploded sectional front elevation showing a step of molding according to an embodiment 7 of the present invention.

Embodiment 7 of FIGS. 31 and 32 is different from the foregoing embodiment 1 in that; the process is manufacturing a quad flat I-lead surface-mounted type resin-sealed package IC; a multiple row lead frame is used in place of the TAB tape such that the chip is bonded to the inner leads in each unit lead frame and wires are individually bridged between the individual inner leads and the chip; the air passage in the transferless resin-sealed package molding apparatus is directly connected in fluid communication with the inside of the cavities; a chip 72B is formed at its outer peripheral portion with a step 80 for relieving the height of the arch of bonding wires 75G so that the wire bonding is executed at that step 80; and the height of the arch of the bonding wires 75G can be relieved by the step 80 so that a resin-sealed package 76G can be formed to have an accordingly reduced thickness.

The molding material to be mounted in advance in the cavity should not be limited to that having the sheet shape but may be formed into a granular shape or may be made semi-fluid and squeezed into the cavity.

In short, the cavity is not pressure charged with the liquid molding material after the molding clamping action but is filled up with the liquid molding material by introducing a non-liquid molding material into the cavity before the mold clamping action and by melting the non-liquid material in the cavity into a liquid sate in the cavity after the mold clamping action.

Our invention has been described as applied to the IC equipped with the surface-packaged type resin-sealed package. The present invention can be applied to a resin-sealed power transistor or other electric devices. An excellent effect can be achieved especially if the present invention is applied to a semiconductor integrated circuit device having an extremely small thickness and a number of pins and required to have a low cost.

While a preferred embodiment has been set forth with specific details, further embodiments, modifications and variations are contemplated according to the broader aspects of the present invention, all as determined by the spirit and scope of the following claims.

What is claimed is:

1. A process for manufacturing a semiconductor integrated circuit device, comprising:
providing into a mold cavity of a mold a semiconductor chip having a plurality of semiconductor elements and a plurality of electrode pads, and a plurality of leads electrically connected with the electrode pads;
introducing a molding material into the mold cavity and thereafter clamping the mold closed;
thereafter melting the molding material into a liquid state in the mold cavity to fill up the inside of the mold cavity; and
thereafter setting the liquid state molding material integrally in the mold cavity to form a resin-sealed package sealing the semiconductor chip and leads.

2. A semiconductor integrated circuit device manufacturing process according to claim 1, further comprising discharging gas from the mold cavity by expanding the liquid molding material.

3. A semiconductor integrated circuit device manufacturing process according to claim 1, further comprising evacuating the mold cavity after said clamping.

4. A semiconductor integrated circuit device manufacturing process according to claim 1, wherein said providing provides the leads individually electrically and mechanically connected with the electrode pads of the semiconductor chip through bumps.

5. A semiconductor integrated circuit device manufacturing process according to claim 1, wherein said providing is such that the semiconductor chip is mechanically connected with grouped inner leads, which are in turn electrically connected with the semiconductor chip through wires.

6. A semiconductor integrated circuit device manufacturing process according to claim 5, wherein said providing is such that the semiconductor chip is formed in its outer peripheral portion with a step, in which the inner leads are electrically connected.

7. A semiconductor integrated circuit device manufacturing process according to claim 1, wherein said introducing and clamping prevent molding material from covering one principal face of the semiconductor chip so that the one principal face is exposed from the resin-sealed package.

8. A semiconductor integrated circuit device manufacturing process according to claim 1, wherein said introducing is such that the semiconductor chip is mechanically connected with grouped inner leads.

9. A semiconductor integrated circuit device manufacturing process according to claim 1, wherein said introducing introduces a first and a different second molding material spaced from each other so that a lead to chip connecting area in the resin-sealed package is molded of the first molding material exhibiting less stress after said setting than before setting and the second molding material exhibits a higher heat conductivity after said setting than before setting.

10. A semiconductor integrated circuit device manufacturing process according to claim 1, wherein said introducing introduces a first and a different second molding material spaced from each other so that a lead to chip connecting area in the resin-sealed package is molded of the first molding material exhibiting less stress after said setting than before setting and the second molding material exhibits a higher mechanical strength after said setting than before setting.

11. A semiconductor integrated circuit device manufacturing process according to claim 1, wherein said introducing introduces a first and a different second molding material spaced from each other so that a lead to chip connecting area in the resin-sealed package is molded of the first molding material exhibiting a decreasing viscosity while it is being melted, and the second molding material exhibits increasing viscosity while it is being melted.

12. A semiconductor integrated circuit device manufacturing process according to claim 1, further comprising discharging excess of the liquid state molding material from the inside of the mold cavity into an outside molding material sump.

13. A semiconductor integrated circuit device manufacturing process according to claim 1, further comprising preventing the liquid state molding material from leaking to the outside by a dam formed outside of the mold cavity to enclose the cavity.

14. A semiconductor integrated circuit device manufacturing process according to claim 2, wherein said discharging discharges gas throughout mold gas passage having communication with the inside of the cavity.

15. A semiconductor integrated circuit device manufacturing process according to claim 1, wherein said introducing provides the molding material formed into a solid sheet shape having a size substantially equal to the size of the top plan shape of the cavity of the mold.

16. A semiconductor integrated circuit device manufacturing process according to claim 15, including extruding a semi-fluid molding material containing a mixture of a raw material containing a main component of a resin into a sheet shape, and cooling the sheet shape molding material to set the semi-fluid molding material prior to said introducing.

17. A semiconductor integrated circuit device manufacturing process according to claim 16, further comprising forming the sheet-shaped molding material to be thicker at its central portion than its peripheral portion prior to said introducing.

18. A process according to claim 17, wherein said forming forms the sheet-shaped molding material with a peripheral recess for relieving bonding wires.

19. A process for manufacturing a semiconductor integrated circuit device comprising the steps of:
preparing a semiconductor chip at which a plurality of electrode pads are formed, said electrode pads being electrically connected to wirings on said chip;
preparing a chip mount member having a plurality of leads each of which has its inner lead end and outer lead end;
electrically connecting said electrode pads to said inner lead ends whereby a semiconductor chip assembly is formed;
placing said assembly in a molding cavity with resin compound material;
heating and melting the compound material to fill the cavity with liquid compound without supplying any resin material from outside the cavity; and
thermally setting the liquid compound to mold a predetermined package IC.

20. A process according to claim 19, including discharging gas from the inside of the cavity by expansion of liquid molding material.

21. A process according to claim 19, including individually electrically and mechanically connecting the leads with the electrode pads of the semiconductor chip through bumps.

22. A process according to claim 19, including mechanically connecting the semiconductor chip with grouped inner leads, which are in turn electrically connected with the semiconductor chip through wires.

23. A process according to claim 19, including molding a lead connecting area of the semiconductor chip in the resin-sealed package of a molding material exhibiting a property having less stress after it has been set than before it has been set, and the remaining area of a molding material exhibiting a higher heat conductivity and/or a higher mechanical strength after it has been set than before it has been set.

24. A process according to claim 19, including molding a lead connecting area of the semiconductor chip in the resin-sealed package of a molding material exhibiting a property having a decreasing viscosity while it is being melted, and the remaining area of a molding material exhibiting a property having an increasing viscosity while it is being melted.

25. A process according to claim 19, including discharging the excess of melted molding material after it has filled from the inside of said cavity into an outside molding material sump.

26. A process according to claim 19, including preventing the molten liquid molding material from leaking to the outside with a dam formed outside of the cavity to enclose the cavity.

27. A process for manufacturing a semiconductor integrated circuit device, comprising the steps of:
preparing a semiconductor chip at which a plurality of electrode pads are formed, the electrode pads being electrically connected to wirings on the chip;
bonding the semiconductor chip to a lead frame having a plurality of leads each of which has an inner lead portion and an outer lead portion;
electrically connecting the electrode pads to the inner lead portions whereby a semiconductor chip assembly is formed;

placing the semiconductor chip assembly in a molding cavity with solid resin compound material;

heating and melting the compound material to fill the cavity with liquid compound without supplying any resin material from outside the cavity; and thermally setting the liquid compound to mold a predetermined part of the assembly with resin.

28. A process according to claim 27, including discharging gas from the inside of the cavity by expansion of liquid molding material.

29. A process according to claim 27, including individually electrically and mechanically connecting the leads with the electrode pads of the semiconductor chip through bumps.

30. A process according to claim 27, including mechanically connecting the semiconductor chip with grouped inner leads, which are in turn electrically connected with the semiconductor chip through wires.

31. A process according to claim 27, including molding a lead connecting area of the semiconductor chip in the resin-sealed package of a molding material exhibiting a property having less stress after it has been set than before it has been set, and the remaining area of a molding material exhibiting a higher heat conductivity and/or a higher mechanical strength after it has been set than before it has been set.

32. A process according to claim 27, including molding a lead connecting area of the semiconductor chip in the resin-sealed package of a molding material exhibiting a property having a decreasing viscosity while it is being melted, and the remaining area of a molding material exhibiting a property having an increasing viscosity while it is being melted.

33. A process according to claim 27, including discharging the excess of melted molding material after it has filled from the inside of said cavity into an outside molding material sump.

34. A process according to claim 27, including preventing the molten liquid molding material from leaking to the outside with a dam formed outside of the cavity to enclose the cavity.

35. A process for manufacturing a semiconductor integrated circuit device, comprising the steps of:

preparing a semiconductor chip at which a plurality of electrode pads are formed;

preparing a carrier tape having a plurality of leads each of which has an inner lead end and an outer lead end;

electrically connecting the electrode pads to said inner lead ends to form a semiconductor chip assembly;

positioning the assembly in a molding cavity with solid resin compound sheets sandwiching the assembly;

heating and melting the compound sheets to fill the cavity with liquid compound; and thermally setting the liquid compound to mold a predetermined part of the assembly with resin.

36. A process for manufacturing a semiconductor integrated circuit device according to claim 35, including discharging gas from the inside of the cavity by expansion of liquid molding material.

37. A process for manufacturing a semiconductor integrated circuit device according to claim 35, including individually electrically and mechanically connecting the leads with the electrode pads of the semiconductor chip through bumps.

38. A process for manufacturing a semiconductor integrated circuit device according to claim 35, including mechanically connecting the semiconductor chip with grouped inner leads, which are in turn electrically connected with the semiconductor chip through wires.

39. A process for manufacturing a semiconductor integrated circuit device according to claim 35, including molding a lead connecting area of the semiconductor chip in the resin-sealed package of a molding material exhibiting a property having less stress after it has been set than before it has been set, and the remaining area of a molding material exhibiting a higher heat conductivity and/or a higher mechanical strength after it has been set than before it has been set.

40. A process for manufacturing a semiconductor integrated circuit device according to claim 35, including molding a lead connecting area of the semiconductor chip in the resin-sealed package of a molding material exhibiting a property having a decreasing viscosity while it is being melted, and the remaining area of a molding material exhibiting a property having an increasing viscosity while it is being melted.

41. A process for manufacturing a semiconductor integrated circuit device according to claim 35, including discharging the excess of melted molding material after it has filled from the inside of said cavity into an outside molding material sump.

42. A process for manufacturing a semiconductor integrated circuit device according to claim 35, including preventing the molten liquid molding material from leaking to the outside with a dam formed outside of the cavity to enclose the cavity.

43. A method of manufacturing a semiconductor integrated circuit sealed package, comprising:

providing a mold having a pressurizable mold cavity;

inserting an integrated circuit body into the mold cavity with leads connected to the integrated circuit body extending from the mold cavity to outside the mold cavity;

placing molding material within the mold cavity without substantially pressurizing the molding material;

closing and pressure sealing the mold cavity so that the molding material substantially fills the space of the mold cavity unoccupied by the integrated circuit body;

thereafter substantially simultaneously pressurizing the molding material, completely filling the mold cavity unoccupied by the integrated circuit body and increasing density of the molding material; and thereafter setting the molding material to a rigid solid permanently bonded to the integrated circuit body.

44. The method of claim 43, including performing said steps of placing and inserting with the mold open and thereafter performing said closing prior to said step of pressure sealing.

45. The method of claim 43, further including, prior to said step of placing, preforming the molding material into a self-sustaining shape generally identical to the shape of the molding material after performing all of said steps.

46. The method of claim 43, wherein said step of pressurizing includes transferring heat into the mold cavity and thereby heating the molding material for expanding the molding material in the mold cavity.

47. The method of claim 43, wherein said step of pressurizing includes transferring heat into the mold cavity and thereby heating the molding material for expanding and liquifying the molding material in the mold cavity.

48. The method of claim 43, wherein said steps are performed so that after said closing, the mold cavity has a substantially flat shape with a thickness two-times or less a corresponding thickness of the integrated circuit body.

49. The method of claim 43, wherein said step of pressure sealing prevents flow of molding material into the mold cavity during said step of pressurizing.

50. The method of claim 47, wherein said step of sealing prevents flow of molding material into the mold cavity during said step of pressurizing and expanding.

51. The method of claim 50, wherein said steps of pressurizing and expanding include forcing molding material from inside the cavity to outside of the cavity.

52. The method of claim 51, wherein said step of placing includes providing at least separate first and second molding materials of different composition within the mold cavity at different locations.

53. The method of claim 52, wherein said step of pressure sealing includes contacting the semiconductor integrated circuit body with mold surfaces to exclude a major generally flat surface of the semiconductor integrated circuit body from exposure to the cavity to prevent contact between the major flat surface and the molding material throughout said steps of pressurizing, filling and increasing.

54. The method of claim 43, wherein said steps of inserting, placing, closing and pressure sealing are performed at substantially atmospheric pressure or less.

55. The method of claim 43, further including gas evacuating the mold cavity during said steps of pressurizing, filling and increasing.

56. A method of claim 51, wherein said step of inserting all of the integrated circuit body and leads on an indefinite length tape having a plurality of additional integrated circuit bodies and leads;
wherein said step of closing and pressure sealing clamps the tape between mold parts; and
wherein said step of forcing extrudes all excess molding material from the mold cavity into sumps within the tape; said step of setting sets the extruded molded material in the sumps in the tape in a rigid solid bonded to the tape to be removed from the mold parts with the tape, so that there is no resin flash.

57. A method of claim 51, wherein said step of pressure sealing includes forming a closed air space in air passage communication with the mold cavity to receive pressurized air during said step of pressurizing the molding material so that the molding material may displace air thereby pressurizing the air passage to substantially the same pressure as the molding material during said step of increasing the density of the molding material, so that there are no undesirable molding material voids.

58. The method of claim 56, wherein said step of closing and pressure sealing seals at least the exterior portion of the leads from the mold cavity with respect to a pressure in the mold cavity substantially greater than the pressure produced by said pressurizing and extruding molding material into the tape sump, so that there is no resin flash.

59. The method of claim 43, wherein said step of placing introduces the molding material into the mold cavity in the form of a flat self-sustaining shape sheet of molding material of substantially the same shape as at least part of the mold cavity that is unoccupied by the integrated circuit body.

60. The method of claim 43, wherein said step of placing introduces the molding material into the mold cavity in the form of a flat self-sustaining shape sheet of molding material having one planer principle surface, an opposed convex principal surface and of substantially the same shape as at least part of the mold cavity that is unoccupied by the integrated circuit body.

61. The method of claim 43 wherein said step of placing introduces the molding material into the mold cavity in the form of a flat self-sustaining shape sheet of molding material, of substantially the same shape as at least part of the mold cavity that is unoccupied by the integrated circuit body, to provide a perpherial recess around one of the principal surfaces for relieving bonding wires of the leads.

* * * * *